(12) United States Patent
Fujimaki

(10) Patent No.: US 8,634,546 B2
(45) Date of Patent: Jan. 21, 2014

(54) SIGNAL PROCESSING DEVICE, ECHO CANCELLER, AND SIGNAL PROCESSING METHOD

(75) Inventor: Sakae Fujimaki, Tokyo (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 971 days.

(21) Appl. No.: 12/531,474

(22) PCT Filed: Mar. 26, 2008

(86) PCT No.: PCT/JP2008/055759
§ 371 (c)(1),
(2), (4) Date: Feb. 26, 2010

(87) PCT Pub. No.: WO2008/123317
PCT Pub. Date: Oct. 16, 2008

(65) Prior Publication Data
US 2010/0150365 A1    Jun. 17, 2010

(30) Foreign Application Priority Data
Mar. 29, 2007   (JP) ................................ 2007-087922

(51) Int. Cl.
*H04M 9/08*   (2006.01)

(52) U.S. Cl.
USPC .................................................. 379/406.08

(58) Field of Classification Search
USPC ................................................... 379/406.08
See application file for complete search history.

(56) References Cited

U.S. PATENT DOCUMENTS

2004/0071284 A1 * 4/2004 Abutalebi et al. ........ 379/406.08

FOREIGN PATENT DOCUMENTS

| JP | 3-243020 A | 10/1991 |
|----|------------|---------|
| JP | 5-216496 A | 8/1993 |
| JP | 8-307323 A | 11/1996 |
| JP | 3391141 B2 | 3/2003 |

OTHER PUBLICATIONS

Stephan Weiβ et al., "Efficient Subband Adaptive Filtering With Oversampled GDFT Filter Banks" IEE Colloquium on Adaptive Signal Processing for Mobile Communication Systems, Oct. 1997, pp. 1-9.
Stephan Weiss, "Analysis and Fast Implementation of Oversampled Modulated Filter Banks", Chapter 23 in John G McWhirter and Ian K. Proudler (eds.) Mathematics in Signal Processing V, IMA, Oxford University Press, pp. 263-274, Mar. 2002.

* cited by examiner

*Primary Examiner* — Alexander Jamal
(74) *Attorney, Agent, or Firm* — Birch, Stewart, Kolasch & Birch, LLP

(57) ABSTRACT

If K=4N, wherein K is a number of subbands and N is a decimation ratio, an analysis filter process unit 21 is used to perform an analysis filter process for every N samples of real-valued input data and output K samples of real-valued data. A GDFT/SSB modulation batch process unit (81) performs a GDFT process and an SSB modulation process on the outputted data by using a real-valued matrix calculation using a (K/2)×K real-valued matrix to output 1 sample×(K/2) channel of real-valued subbands data. Moreover, an SSB demodulation/inverse GDFT batch process unit (82) performs an SSB demodulation process and an inverse GDFT process on 1 sample×(K/2) channel of real-valued subbands data by a real-valued matrix calculation using a K×(K/2) real-valued matrix and outputs K samples of real-valued data. The outputted data is subjected to a synthesis filter process by a synthesis filter process unit (24) to output N samples of real-valued data.

6 Claims, 18 Drawing Sheets

*F I G. 4*

COSINE FUNCTION TABLE 91

| $\Delta$ | $\cos\left\{\dfrac{2\pi}{2K}(n_0+\Delta)\right\}$ |
|---|---|
| 0 | $\cos\left\{\dfrac{2\pi}{2K}(n_0)\right\}$ |
| 1 | $\cos\left\{\dfrac{2\pi}{2K}(n_0+1)\right\}$ |
| $\vdots$ | $\vdots$ |
| $2K-2$ | $\cos\left\{\dfrac{2\pi}{2K}(n_0+2K-2)\right\}$ |
| $2K-1$ | $\cos\left\{\dfrac{2\pi}{2K}(n_0+2K-1)\right\}$ |

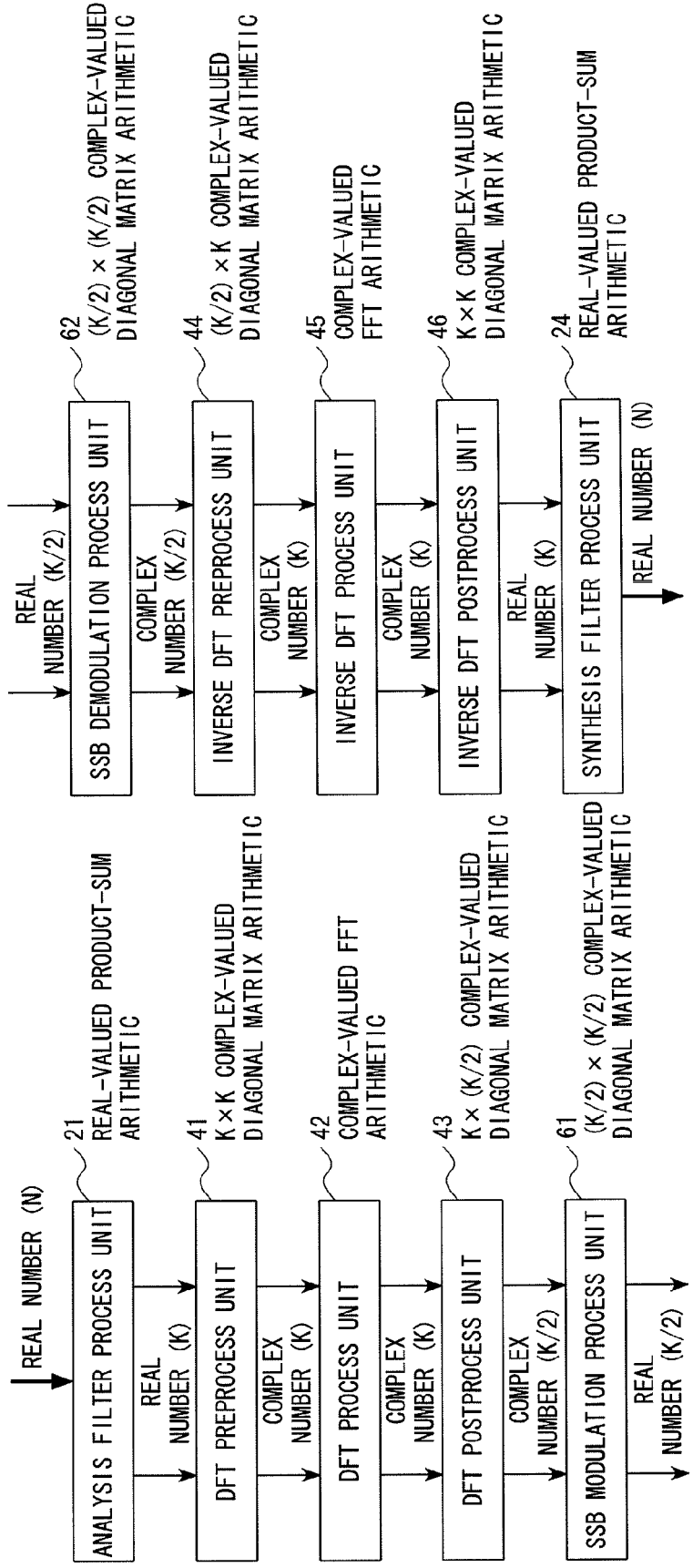

SIGNAL PROCESSING DEVICE, ECHO CANCELLER, AND SIGNAL PROCESSING METHOD

TECHNICAL FIELD

The present invention relates to a signal processing device, an echo canceller, and a signal processing method that perform a frequency bands analysis/synthesis process applicable to voice processing which includes cancelling an echo generated due to voice reflection in a vehicle to order to improve quality of speech voice when a cellular phone is used in the vehicle (closed space).

BACKGROUND ART

As shown in FIG. 8, Patent Document 1 is an application which relates to a frequency bands analysis type subband echo canceller whose configuration includes a subband analysis process unit 11, an echo cancelling process unit 12 that performs a complex-valued process and a frequency bands synthesis process unit 13. In general, frequency bands analysis/synthesis is performed by a configuration of a combination of an analysis/synthesis filter using a low-pass filter referred to as a prototype filter on which an example of frequency response of a low-pass signal is shown in FIG. 9 and a DFT (Discrete Fourier Transform)/inverse DFT as shown in FIG. 10A and FIG. 10B, and by configuring a band-pass filter represented by exemplifying eight subbands Ba1 to Ba8 in FIG. 11. It should be noted that a broken line Sa is a curve representing frequency property of an input signal.

Further, explaining the above-mentioned signal processing device in FIG. 10A and FIG. 10B, it is configured such that a modulation side comprises an analysis filter process unit 21 including a circuit of signal division process series where number of subbands is K and decimation ratio is N and a DFT process unit 22 as shown in FIG. 10A, and demodulation side comprises an inverse DFT process unit 23 and an synthesis filter process unit 24 including a circuit of signal synthesis process series where number of subbands is K and decimation ratio is N as shown in FIG. 10B.

The subband echo canceller improves convergence of the echo canceller. Additionally, decimating of sampling in each band reduces the rate of the signal, thereby allowing the amount of arithmetic to be reduced. For instance, provided that the number of subbands is K and the decimation rate is N (sampling once from N times in each subband) as described above, N can theoretically be increased to K at the maximum. In this case, the signal rate in each subband becomes 1/K of the original signal rate.

A drawback of the method described in Patent Document 1 is that the subband signals become complex numbers as shown in FIG. 8 and an echo canceller compliant with complex numbers is required in the case of the subband echo canceller. In estimation of the amount of arithmetic, complex-valued arithmetic is for convenience' sake counted four times as many as real arithmetic. However, there is a possibility that a general-purpose processor not optimized for complex-valued arithmetic requires overhead processes such as data loading/storing, thereby greatly increasing the amount of processing.

Then, in Patent Document 2, as shown in FIG. 12, an SSB modulation process unit 31 performing a process referred to as SSB (Single Side Band) modulation, which is modulation suppressing a carrier wave and a single side band in amplitude modulation, is additionally provided, thereby making the subband signals real numbers. Subsequent to the SSB modulation process unit 31, an echo cancelling process unit 32 performing a real-valued process, and an SSB demodulation process unit 33 are provided, subsequent to which the above-mentioned subband synthesis process unit 13 is further provided.

In this configuration, the echo canceller can be what is compliant with real numbers. However, the theoretically maximum value of decimation ratio becomes K/2, thereby reducing an advantage of reduction in the amount of arithmetic due to reduction of signal speed in each subband. Provided that the number of subbands is K, $W_K$ is defined as a following equation (1), inputs are y(n) where n=0, ..., K−1, and outputs are $Y_k$ where k=0, ..., K−1, an equation of DFT is represented in a following equation (2). Provided that inputs are $Y_k$ where k=0, ..., K−1 and outputs are y(n), n=0, ..., K−1, an equation of the inverse DFT is represented in a following equation (3).

[Expression 1]
$$W_K = e^{j(2\pi/K)} \qquad (1)$$

[Expression 2]
$$Y_K = \sum_{n=0}^{K-1} y(n) W_K^{-kn} \qquad (2)$$
$$k = 0, 1, \ldots, K-1$$

[Expression 3]
$$y(n) = \frac{1}{K} \sum_{k=0}^{K-1} Y_k W_K^{kn} \qquad (3)$$
$$n = 0, 1, \ldots, K-1$$

When K is a power of two, FFT (Fast Fourier Transform) is applicable and the amount of arithmetic can be reduced.

Incidentally, the methods described in Patent Document 1 and Patent Document 2 are referred to as even types, and the center frequency $\omega_k$ in each band is represented as a following equation (4) as shown in FIG. 11 that represents a case where the number of subbands is K=8.

[Expression 4]
$$\omega_k = \frac{2\pi k}{K} \qquad (4)$$
$$k = 0, 1, \ldots, K-1$$

While in FIG. 11 the frequency properties are illustrated with the broken line where the sampling frequency is $2\pi$ and the input signal Sa is real numbers including frequency components 0 to π, with respect to them the even type cannot cover input signal components of 0 to π (a part of the broken line from 0 to π) properly by four subbands Ba1 to Ba4 up to K/2. In other words, five subbands including Ba5 are required.

On the other hand, according to the method referred to as an odd type, the centre frequency in each subband is represented in a following equation (5). A case where K=8 is shown in FIG. 13. In the figure, solid lines Bb1 to Bb8 are representing the frequency responses of eight subbands, and a broken line Sa is a curve representing the frequency property of an input signal.

[Expression 5]

$$\omega_k = \frac{2\pi k}{K} + \frac{\pi}{K} \quad (5)$$
$$k = 0, 1, \ldots, K-1$$

The odd type can cover all of input signal components of 0 to π (a part of the broken line from 0 to π) by the four subbands Bb1 to Bb 4, and is more preferable in performance than the even type. As shown in FIG. 15A and FIG. 15B, the odd type is actualized by a GDFT process unit 51 that performs GDFT (Generalized DFT: Generalized Discrete Fourier Transformer) process on the basis of a following equation (6) including a frequency offset $k_0$ and a time offset $n_0$, and an inverse GDFT process unit 52 performing an inverse GDFT process on the basis of a following equation (7) where the frequency offset is set to $k_0$=½. However, because use of this GDFT process increases the amount of arithmetic, a configuration including a DFT process and an inverse DFT process as shown in FIG. 14A and FIG. 14B that is described in Non-Patent Document 1 is typically used. More specifically, it is configured such that a modulation side includes the above-mentioned analysis filter process unit 21, a DFT preprocess unit 41, a DFT process unit 42 and a DFT postprocess unit 43 as shown in FIG. 14A, and a demodulation side includes an inverse DFT preprocess unit 44, an inverse DFT process unit 45, an inverse DFT postprocess unit 46, and the above-mentioned synthesis filter process unit 24 as shown in FIG. 14B.

In the configuration, the four process units, or the DFT preprocess unit 41 and the DFT postprocess unit 43 on the modulation side and the inverse DFT preprocess unit 44 and the inverse DFT postprocess unit 46 on the demodulation side, each includes complex-valued multiplication arithmetic on each subband. Furthermore, when the number of subbands K is a power of two, an FFT is applicable to the DFT process unit 42 and the inverse DFT process unit 45, thereby allowing the amount of arithmetic to be reduced.

[Expression 6]

$$Y_K^{GDFT} = \sum_{u=0}^{K-1} y(n) W_K^{-(k+k_0)(n+n_0)} \quad (6)$$
$$k = 0, 1, \ldots, K-1$$

[Expression 7]

$$y(n) = \frac{1}{K}\sum_{k=0}^{K-1} Y_k^{GDFT} W_K^{(k+k_0)(n+n_0)} \quad (7)$$
$$n = 0, 1, \ldots, K-1$$

Patent Document 1: JP 03-243020 A,
Patent Document 2: JP 3391144 B,
Non-Patent Document 1: S. Weiss. Analysis and Fast Implementation of Oversampled Modulated Filter Banks, Chapter 23 in John G McWhirter and Ian K. Proudler (eds.): Mathematics in Signal Processing V, IMA, Oxford University Press, pp. 263-274, March 2002.

DISCLOSURE OF THE INVENTION

Incidentally, when the subband echo canceller that is an odd type and a real-valued type is implemented in a device to be implemented, the GDFT process unit and the SSB modulation process unit are connected to each other. However, since use of GDFT process increases the amount of arithmetic, the odd type using an FFT process described in Non-Patent Document 1 is typically used. As shown in FIG. 16A and FIG. 16B, this signal processing device has a configuration where an SSB modulation process unit 61 is connected to a downstream of the DFT postprocess unit 43 on the modulation side, an SSB demodulation process unit 62 is connected to an upstream of the inverse DFT preprocess unit 44 on the demodulation side, in addition to the configuration shown in FIG. 14A and FIG. 14B. What are illustrated on the top and bottom of process blocks and the right side of the process blocks in FIG. 16A and FIG. 16B are data types and numbers to be inputted or outputted to respective blocks, and details on the process and times of the process, with a precondition including the number of subbands: K, decimation ratio: N, sampling frequency: 2π, input of the analysis filter process unit 21: a real number composed of a frequency component equal to or less than π, the number of channels of output of the SSB modulation process unit 61 and input of the SSB demodulation process unit 62: K/2.

However, according to the process method described in Non-Patent Document 1, there is a problem that a possibility of deteriorating arithmetic accuracy is raised when the implement target is a 16-bit fixed point processor such as a general purpose processor to be embedded.

For instance, as shown in FIG. 17, it is provided that the basic architecture of the processor is configured by comprising a 16-bit wide data memory unit 71, a multiplier accumulator unit 72 that accumulates a multiplication result of 16 bits×16 bits in accumulator (32+α) bits where α is a guard bit, and a shift/round process unit 73 that fetches appropriate 16 bits from the product-sum arithmetic result (32+α) bits in the accumulator.

In this case, since 32 bits cannot be stored in the data memory unit 71 as they are, the shift/round process unit 73 performs a process of rounding off (32+α) bits to 16 bits. This occurs the number of FFT stages+2 (preprocess and postprocess) times. According to the number of occurrence, or multiple times of cyclic processes through the data memory unit 71, the multiplier accumulator unit 72 and the shift/round process unit 73, rounding error occurs in every circuit. Thus, sufficient arithmetic accuracy cannot be secured under certain circumstances.

The present invention is made in view of these problems. It is an object of the present invention to provide a signal processing device, an echo canceller, and a signal processing method that allow deterioration of arithmetic accuracy due to adoption of fixed point arithmetic to hardly be created with the amount of arithmetic as small as possible in a case where a real time voice processing is used as an application when performing an odd type and real-valued type subband analysis/synthesis process.

In order to solve the above problems, according to an aspect of the present invention, there is provided a signal processing device performing a subband analysis process on an input signal, characterized by comprising: analysis filter process means for performing an analysis filter process on every N samples of real-valued input data and outputting K samples of real-valued data if K=4N, where K is the number of subbands and N is a decimation ratio; and GDFT/SSB modulation batch process means for performing a GDFT process, which is a Generalized Discrete Fourier Transformation process, and an SSB modulation process, which is a single sideband modulation process adjusting a center frequency after the subband analysis process to π/2, by a product arithmetic in batch between a (K/2)×K real-valued matrix and a K×1 real-valued matrix, on the K samples of real-valued data inputted from the analysis filter process means, and outputting 1 sample×(K/2) channel of real-valued subbands data.

Further, according to another aspect of the present invention, there is provided a signal processing device performing a subband analysis process on an input signal, characterized by comprising: analysis filter process means for performing an analysis filter process on every N samples of real-valued input data and outputting K samples of real-valued data if K=4N, where K is the number of subbands and N is a decimation ratio; and GDFT/SSB modulation batch process means for performing in batch a GDFT process, which is a Generalized Discrete Fourier Transformation process where a frequency offset is ½ and a time offset is $n_0$, and an SSB modulation process, which is a single sideband modulation process, using (K/2)×K real-valued matrix $G_1(m)$ represented in an equation and according to an equation $$\begin{bmatrix} X_0^{SSB}(m) \\ X_1^{SSB}(m) \\ \ldots \\ X_{K/2-1}^{SSB}(m) \end{bmatrix} = G_1(m) \begin{bmatrix} x_m(0) \\ x_m(1) \\ \ldots \\ x_m(K-1) \end{bmatrix} \quad \text{[Expression 2]}$$

$$m = 0, 1, \ldots$$

on K samples of real-valued data, $x_m(0), x_m(1), \ldots, x_m(k-1)$, outputted from the analysis filter process means provided that time index of the K samples of real-valued data from the analysis filter process means is m, and outputting 1 sample×(K/2) channel of real-valued subbands data, $X_0^{SSB}(m), X_1^{SSB}(m), \ldots, X_{K/2-1}^{SSB}(m)$.

According to further another aspect of the present invention, there is provided the signal processing device, characterized by further comprising storage means for storing the periodically occurring eight patterns of (K/2)×K real-valued matrix for performing the GDFT process and the SSB modulation process if K=4N, where K is the number of subbands and N is a decimation ratio, wherein the GDFT/SSB modulation batch process means performs the GDFT process and the SSB modulation process in batch using the (K/2)×K real-valued matrix stored in the storage means.

According to yet another aspect of the present invention, there is provided a signal processing device performing a subband synthesis process on an input signal, characterized by comprising: SSB demodulation/inverse GDFT batch process means for performing an SSB demodulation process, which is a single sideband demodulation process restoring a frequency having been frequency-shifted by the SSB modulation process frequency-shifting a center frequency after the subband analysis process to π/2 to a frequency before the frequency-shifting, and an inverse GDFT process, which is an inverse Generalized Discrete Fourier Transformation process, by a product arithmetic in batch between a K×(K/2) real-valued matrix and a (K/2)×1 real-valued matrix on every input of 1 sample×(K/2) channel of real-valued subbands data, and outputting K samples of real-valued data, if K=4N, where K is the number of subbands and N is a decimation ratio; and synthesis filter process means for performing a synthesis filter process on K samples of real-valued data inputted from the SSB demodulation/inverse GDFT batch process means and outputting N samples of real-valued data.

According to another aspect of the present invention, there is provided a signal processing device performing subband synthesis process on an input signal, characterized by comprising:

[Expression 1]

$$G_1(m) = \begin{bmatrix} \cos\left[\frac{2\pi}{2K}\left\{(n_0 - \frac{Km}{4})\right\}\right] & \cos\left[\frac{2\pi}{2K}\left\{(n_0 + 1) - \frac{Km}{4}\right\}\right] & \ldots & \cos\left[\frac{2\pi}{2K}\left\{(n_0 + K - 1) - \frac{Km}{4}\right\}\right] \\ \cos\left[\frac{2\pi}{2K}\left\{3n_0 + \frac{Km}{4}\right\}\right] & \cos\left[\frac{2\pi}{2K}\left\{3(n_0 + 1) + \frac{Km}{4}\right\}\right] & \ldots & \cos\left[\frac{2\pi}{2K}\left\{3(n_0 + K - 1) + \frac{Km}{4}\right\}\right] \\ \ldots & \ldots & \ldots & \ldots \\ \cos\left[\frac{2\pi}{2K}\left\{(K-1)n_0 + \frac{K(K-3)m}{4}\right\}\right] & \cos\left[\frac{2\pi}{2K}\left\{(K-1)(n_0 + 1) + \frac{K(K-3)m}{4}\right\}\right] & \ldots & \cos\left[\frac{2\pi}{2K}\left\{(K-1)(n_0 + K - 1) + \frac{K(K-3)m}{4}\right\}\right] \end{bmatrix}$$

$$m = 0, 1, \ldots$$

SSB demodulation/inverse GDFT batch process means for performing in batch, using a K×(K/2) real-valued matrix $G_9(m)$ represented in an equation

[Expression 3]

$$G_2(m) = \begin{bmatrix} \cos\left[\frac{2\pi}{2K}\left\{(n_0 - \frac{Km}{4})\right\}\right] & \cos\left[\frac{2\pi}{2K}\left\{3n_0 + \frac{Km}{4}\right\}\right] & \cdots & \cos\left[\frac{2\pi}{2K}\left\{\begin{array}{c}(K-1)n_0 + \\ \frac{K(K-3)m}{4}\end{array}\right\}\right] \\ \cos\left[\frac{2\pi}{2K}\left\{(n_0+1) - \frac{Km}{4}\right\}\right] & \cos\left[\frac{2\pi}{2K}\left\{3(n_0+1) + \frac{Km}{4}\right\}\right] & \cdots & \cos\left[\frac{2\pi}{2K}\left\{\begin{array}{c}(K-1)(n_0+1) + \\ \frac{K(K-3)m}{4}\end{array}\right\}\right] \\ \cdots & \cdots & \cdots & \cdots \\ \cos\left[\frac{2\pi}{2K}\left\{\begin{array}{c}(n_0+K-1) - \\ \frac{Km}{4}\end{array}\right\}\right] & \cos\left[\frac{2\pi}{2K}\left\{\begin{array}{c}3(n_0+1) + \\ \frac{Km}{4}\end{array}\right\}\right] & \cdots & \cos\left[\frac{2\pi}{2K}\left\{\begin{array}{c}(K-1) \\ (n_0+K-1) + \\ \frac{K(K-3)m}{4}\end{array}\right\}\right] \end{bmatrix}$$

$m = 0, 1, \ldots$ and according to an equation $$\begin{bmatrix} x'_m(0) \\ x'_m(1) \\ \cdots \\ x'_m(K-1) \end{bmatrix} = G_2(m) \begin{bmatrix} X_0'^{SSB}(m) \\ X_1'^{SSB}(m) \\ \cdots \\ X_{K/2-1}'^{SSB}(m) \end{bmatrix}$$ [Expression 4]

$m = 0, 1, \ldots$ on every input of 1 sample×(K/2) channel of real-valued provided that a time index of the real-valued subbands data is m and outputtles of real-valued data, $x'_m(0)$, $x'_m(1)$, ..., $x'_m(k-1)$, if K=4N, where K is the number of subbands and N is a decimation ratio; and synthesis filter process means for performing a synthesis filter process on the K samples of real-valued data inputted from the SSB demodulation/inverse GDFT batch process means and outputting N samples of real-valued data.

According to further another aspect of the present invention, there is provided the signal processing device characterized by further comprising storage means for storing the periodically occurring eight patterns of K×(K/2) real-valued matrix for performing the SSB demodulation process and the inverse GDFT process if K=4N, where K is the number of subbands and N is a decimation ratio, wherein the SSB demodulation/inverse GDFT batch process means performs the SSB demodulation process and the inverse GDFT process in batch using the K×(K/2) real-valued matrix stored in the storage means.

According to yet another aspect of the present invention, there is provided the signal processing device, performing a subband analysis process on an input signal, characterized by comprising: analysis filter process means for performing an analysis filter process on every N samples of real-valued input data and outputting K samples of real-valued data if K=4N, where K is the number of subbands and N is a decimation ratio; GDFT/SSB modulation batch process means for performing a GDFT process, which is a Generalized Discrete Fourier Transformation process, and an SSB modulation process, which is a single sideband modulation process adjusting a center frequency after the subband analysis process to π/2, by a (K/2)×K real-valued matrix arithmetic in batch, on the real-valued data of K samples inputted from the analysis filter process means, and outputting 1 sample× (K/2) channel of real-valued subbands data; SSB demodulation/inverse GDFT batch process means for performing an SSB demodulation process, which is a single sideband demodulation process restoring a frequency whose center frequency after the subband analysis process has been frequency-shifted to π/2 to a frequency before the frequency-shifting by the SSB modulation process, and an inverse GDFT process, which is an inverse Generalized Discrete Fourier Transformation process, by a K×(K/2) real-valued matrix arithmetic in batch on every input of 1 sample×(K/2) channel of real-valued subbands data, and outputting K samples of real-valued data; and synthesis filter process means for performing a synthesis filter process on the K samples of real-valued data inputted from the SSB demodulation/inverse GDFT batch process means and outputting N samples of real-valued data.

According to another aspect of the present invention, there is provided the signal processing device, characterized in that the (K/2)×K real-valued matrix and the K×(K/2) real-valued matrix are matrices in transpositional relationship to each other, the device further comprises storage means for storing any one of the (K/2)×K real-valued matrix and the K×(K/2) real-valued matrix, the GDFT/SSB modulation batch process means performs the GDFT process and the SSB modulation process using the stored (K/2)×K real-valued matrix or the K×(K/2) real-valued matrix, and the SSB demodulation/inverse GDFT batch process means performs the SSB demodulation process and the inverse GDFT process using the stored (K/2)×K real-valued matrix or the K×(K/2) real-valued matrix.

According to further another aspect of the present invention, there is provided the signal processing device, characterized in that provided that a time offset of the GDFT process and the inverse GDFT process is $n_0$, if $2n_0$ is an integer, creating a table of a cosine function with $2\pi/2K$ resolution and storing the table as a cosine function table in storage means, using a fact that every element of the (K/2)×K real-valued matrix and the K×(K/2) real-valued matrix can be represented as a cosine function value with $2\pi/2K$ resolution, and the GDFT/SSB modulation batch process means performs the GDFT process and the SSB modulation process using the cosine function of the stored cosine function table, and the SSB demodulation/inverse GDFT batch process means performs the SSB demodulation process and the inverse GDFT process using the cosine function of the stored cosine function table.

According to yet another aspect of the present invention, there is provided an echo canceller characterized in that the signal processing device according to any one of above described aspects of the signal processing device, is used for the subband analysis process or the subband synthesis process on the input signal.

According to further another aspect of the present invention, there is provided a signal processing method according to the present invention is a signal processing method performing a subband analysis process and a subband synthesis process on an input signal, characterized by comprising: a first step of performing an analysis filter process on every N samples of real-valued input data and outputting K samples of real-valued data if K=4N, where N is the number of subbands and N is a decimation ratio; a second step of performing in batch a GDFT process, which is a Generalized Discrete Fourier Transformation process where a frequency offset is ½ and a time offset is $n_0$, and an SSB modulation process, which is a single sideband modulation process, using (K/2)×K real-valued matrix $G_1(m)$ represented in an equation and according to an equation $$\begin{bmatrix} X_0^{SSB}(m) \\ X_1^{SSB}(m) \\ \ldots \\ X_{K/2-1}^{SSB}(m) \end{bmatrix} = G_1(m) \begin{bmatrix} x_m(0) \\ x_m(1) \\ \ldots \\ x_m(K-1) \end{bmatrix} \quad \text{[Expression 6]}$$

$$m = 0, 1, \ldots$$

on the K samples of real-valued data, $x_m(0)$, $x_m(1, \ldots, x_m(k-1)$, outputted by the first step provided that a time index of the K samples of real-valued data is m, and outputting 1 sample×(K/2) channel of real-valued subbands data, $X_0^{SSB}(m)$, $X_1^{SSB}(m), \ldots, X_{K/2-1}^{SSB}(m)$; a third step of performing signal processing on every K/2 channel of subbands with respect to the 1 sample×(K/2) channel of real-valued subbands data outputted by the second step, and outputting 1 sample×(K/2) channel of real-valued subbands data a fourth step of performing in batch an SSB demodulation process, which is a single sideband demodulation process, and an inverse GDFT process, which is an inverse Generalized Discrete Fourier Transformation process, where a time index of the 1 sample×(K/2) channel of real-valued subbands data outputted by the third step is m, using K×(K/2) real-valued matrix $G_2(m)$ represented in an equation

[Expression 5]

$$G_1(m) = \begin{bmatrix} \cos\left[\frac{2\pi}{2K}\left\{(n_0 - \frac{Km}{4})\right\}\right] & \cos\left[\frac{2\pi}{2K}\left\{(n_0+1) - \frac{Km}{4}\right\}\right] & \ldots & \cos\left[\frac{2\pi}{2K}\left\{\frac{(n_0+K-1)-}{\frac{Km}{4}}\right\}\right] \\ \cos\left[\frac{2\pi}{2K}\left\{3n_0 + \frac{Km}{4}\right\}\right] & \cos\left[\frac{2\pi}{2K}\left\{3(n_0+1) + \frac{Km}{4}\right\}\right] & \ldots & \cos\left[\frac{2\pi}{2K}\left\{\frac{3(n_0+K-1)+}{\frac{Km}{4}}\right\}\right] \\ \ldots & \ldots & \ldots & \ldots \\ \cos\left[\frac{2\pi}{2K}\left\{\frac{(K-1)n_0+}{\frac{K(K-3)m}{4}}\right\}\right] & \cos\left[\frac{2\pi}{2K}\left\{\frac{(K-1)(n_0+1)+}{\frac{K(K-3)m}{4}}\right\}\right] & \ldots & \cos\left[\frac{2\pi}{2K}\left\{\frac{(K-1)}{(n_0+K-1)+} \frac{K(K-3)m}{4}\right\}\right] \end{bmatrix}$$

$$m = 0, 1, \ldots$$

[Expression 7]

$$G_2(m) = \begin{bmatrix} \cos\left[\frac{2\pi}{2K}\left\{(n_0 - \frac{Km}{4})\right\}\right] & \cos\left[\frac{2\pi}{2K}\left\{3n_0 + \frac{Km}{4}\right\}\right] & \cdots & \cos\left[\frac{2\pi}{2K}\left\{\frac{(K-1)n_0 + K(K-3)m}{4}\right\}\right] \\ \cos\left[\frac{2\pi}{2K}\left\{(n_0+1) - \frac{Km}{4}\right\}\right] & \cos\left[\frac{2\pi}{2K}\left\{3(n_0+1) + \frac{Km}{4}\right\}\right] & \cdots & \cos\left[\frac{2\pi}{2K}\left\{\frac{(K-1)(n_0+1) + K(K-3)m}{4}\right\}\right] \\ \cdots & \cdots & \cdots & \cdots \\ \cos\left[\frac{2\pi}{2K}\left\{(n_0+K-1) - \frac{Km}{4}\right\}\right] & \cos\left[\frac{2\pi}{2K}\left\{3(n_0+K-1) + \frac{Km}{4}\right\}\right] & \cdots & \cos\left[\frac{2\pi}{2K}\left\{\frac{(K-1)(n_0+K-1) + K(K-3)m}{4}\right\}\right] \end{bmatrix}$$

$m = 0, 1, \ldots$ and according to an equation $$\begin{bmatrix} x'_m(0) \\ x'_m(1) \\ \cdots \\ x'_m(K-1) \end{bmatrix} = G_2(m) \begin{bmatrix} X'^{SSB}_0(m) \\ X'^{SSB}_1(m) \\ \cdots \\ X'^{SSB}_{K/2-1}(m) \end{bmatrix}$$ [Expression 8]

$m = 0, 1, \ldots$ on every input with respect to the real-valued subbands data, $X'^{SSB}_0(m)$, $X'^{SSB}_1(m)$, ..., $X'^{SSB}_{K/2-1}(m)$, and outputting K samples of real-valued data, $x'_m(0)$, $x'_m(1)$, ..., $x'_m(k-1)$; and a fifth step of performing a synthesis filter process on the K samples of real-valued data outputted by the fourth step, and outputting N samples of real-valued data.

The present invention has advantageous effects that allow deterioration of arithmetic accuracy due to adoption of fixed point arithmetic to hardly be created with amount of arithmetic as small as possible in a case where a real time voice processing is used as an application when performing odd type and real-valued type subband analysis/synthesis process.

BRIEF DESCRIPTION OF THE DRAWINGS

FIG. 4 is a diagram showing a cosine function table having a cosine function value to be substituted in a determinant that is one characterizing an embodiment;

FIG. 16A is a block diagram showing a configuration of a signal processing device for a conventional odd type subband analysis process, and FIG. 16B is a block diagram showing a configuration of a signal processing device for a conventional odd type subband synthesis process;

Figure 1A:
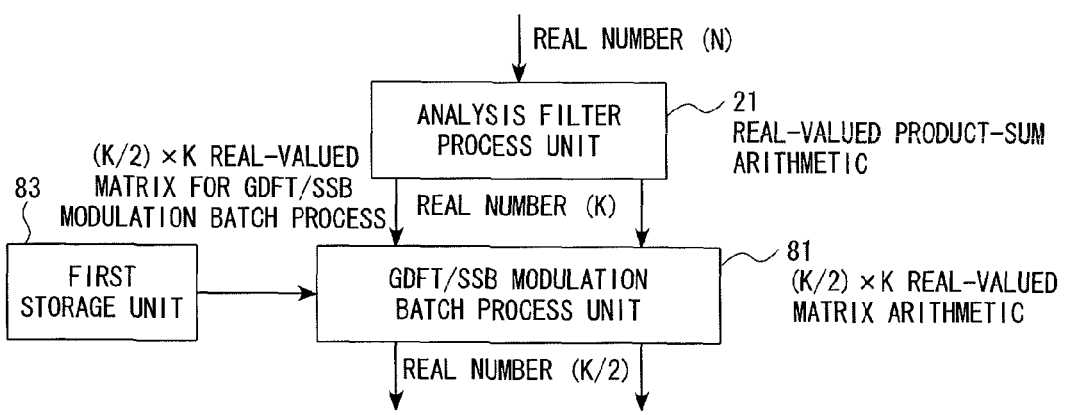
FIG. 1A and FIG. 1B are the block diagrams showing a configuration of a signal processing device according to an embodiment of the present invention.

DESCRIPTION OF SYMBOLS 21 analysis filter process unit
22 DFT process unit 23 inverse DFT process unit
24 synthesis filter process unit
31 SSB modulation process unit
32 echo cancelling process unit
33 SSB demodulation process unit
41 DFT preprocess unit
42 DFT process unit
43 DFT postprocess unit
44 inverse DFT preprocess unit
45 inverse DFT process unit
46 inverse DFT postprocess unit
51 GDFT process unit
52 inverse GDFT process unit
61 SSB modulation process unit
62 SSB demodulation process unit
71 data memory unit
72 multiplier accumulator unit
73 shift/round process unit
81 GDFT/SSB modulation batch process unit
82 SSB demodulation/inverse GDFT batch process unit
83 first storage unit
84 second storage unit
85 storage unit
91 cosine function table
101 conventional method
102 method of the present invention

BEST MODE FOR CARRYING OUT THE INVENTION

An embodiment of the present invention will hereinafter be described with reference to the drawings. It should be noted that identical symbols are assigned to elements corresponding to each other and on repeated elements latter description will appropriately omitted throughout the entire drawings in the specification.

Figure 1B:
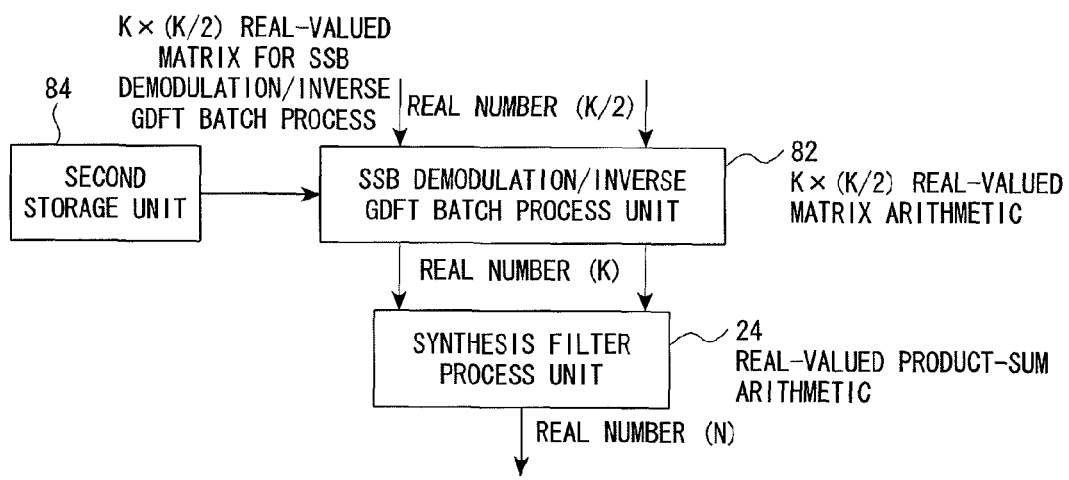

FIG. 1A and FIG. 1B show configurations of signal processing devices according to an embodiment of the present invention, FIG. 1A is a block diagram showing the configuration of the signal processing device in a modulation side, and FIG. 1B is a block diagram showing the configuration of the signal processing device in a demodulation side.

The signal processing device shown in FIG. 1A and FIG. 1B is configured by comprising an analysis filter process unit 21, a GDFT/SSB modulation batch process unit 81 and a first storage unit 83 storing a (K/2)×K real-valued matrix for a GDFT/SSB modulation batch process on the modulation side (subband analysis process side) as shown in FIG. 1A; and an SSB demodulation/inverse GDFT batch process unit 82, a synthesis filter process unit 24 and a second storage unit 84 storing a K×(K/2) real-valued matrix for an SSB demodulation/inverse GDFT batch process on the demodulation side (subband synthesis process side) as shown in FIG. 1B. Provided that K=4N where the number of subbands is K and the decimation rate is N, an input signal is a real number, and a frequency component included when a sampling frequency is 2π, is π or less. It is also a precondition that the signal processing device is applied to an echo canceller in this embodiment.

When the subband analysis process is performed in the signal processing device on the modulation side shown in FIG. 1A, the analysis filter process unit 21 performs the analysis filter process on every N samples of real-valued input data and outputs K samples of real-valued data, the GDFT/SSB modulation batch process unit 81 subsequently performs in batch the GDFT process and SSB modulation process by product arithmetic between the (K/2)×K real-valued matrix and K×1 real-valued matrix, using as inputs the K samples of real-valued data and the (K/2)×K real-valued matrix for the GDFT/SSB modulation batch process having preliminary been calculated and stored in the first storage unit 83, and outputs one sample×(K/2) channels of real-valued subband analysis data.

In the signal processing device for the subband synthesis process shown in FIG. 1B, the SSB demodulation/inverse GDFT batch process unit 82 performs in batch the SSB demodulation process and the inverse GDFT process by product arithmetic between the K×(K/2) real-valued matrix and (K/2)×1 real-valued matrix, using as inputs one sample×(K/2) channels of real-valued subband analysis data and the K×(K/2) real-valued matrix for the SSB demodulation/inverse GDFT batch process having preliminary been calculated and stored in the second storage unit 84, and outputs K samples of real numbers, and the synthesis filter process unit 24 subsequently performs the synthesis filter process using the K samples of real numbers as inputs, and outputs N samples.

[example of the GDFT process and the matrix for the SSB modulation process when the number of subbands is K and the decimation rate is N=K/4]

In such configuration, first of all, an example of the GDFT process and the matrix for the SSB modulation process when the number of subbands is K and the decimation rate is N=K/4 in the signal processing device for the subband analysis process shown in FIG. 1A will be described.

To begin with, the SSB modulation process will be described.

Figure 2:
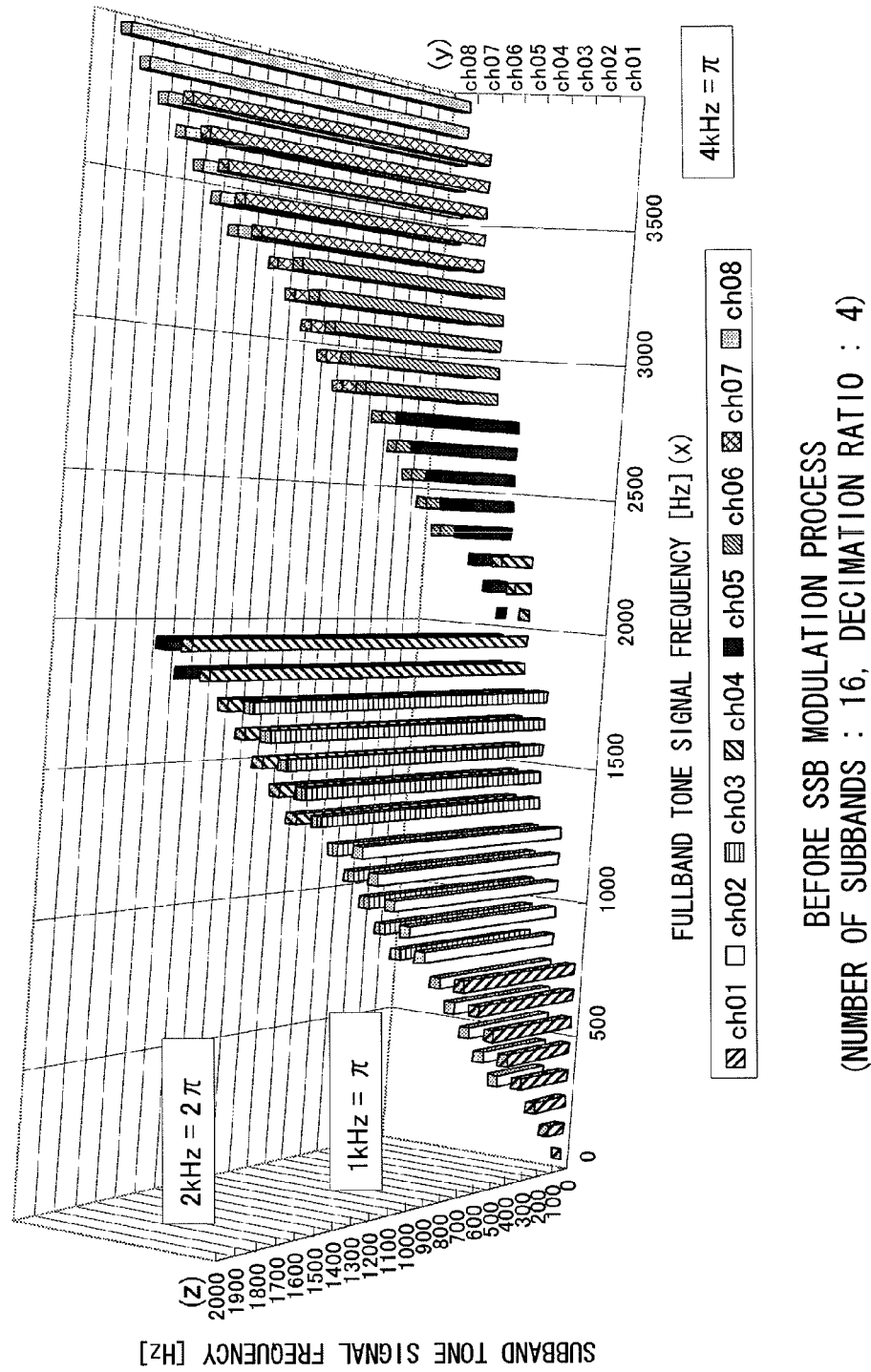
FIG. 2 is a graph showing correspondence of frequencies between before and after an odd type subband analysis process when the number of subbands is 16 and the decimation rate is four on a channel-by-channel basis.

FIG. 2 is a graph showing correspondence of frequencies between before and after (x, z) a subband analysis process, from a channel (ch) 1 to a channel (ch) 8 on the y axis when the number of subbands is 16 and the decimation rate is four, with respect to an 8 kHz sampled single tone signal from 100 Hz to 3900 Hz in 100 Hz steps shown on the x axis. More specifically, the x axis represents single tone signal frequencies of full band before the subband analysis processing. The z axis represents single tone signal frequencies of subband after the subband analysis process. The y axis represents frequency channels.

It is understood that in the analysis filter process unit 21, because of the odd type subband analysis process, the center frequency is disposed from 250 Hz to 3750 Hz on every 500 Hz as shown along the x axis, and the frequency band from 0 to 4 kHz is entirely covered by eight frequency channels (ch01 to ch08). It should be noted that the center frequencies after the subband analysis process also vary from channel to channel.

Figure 3:
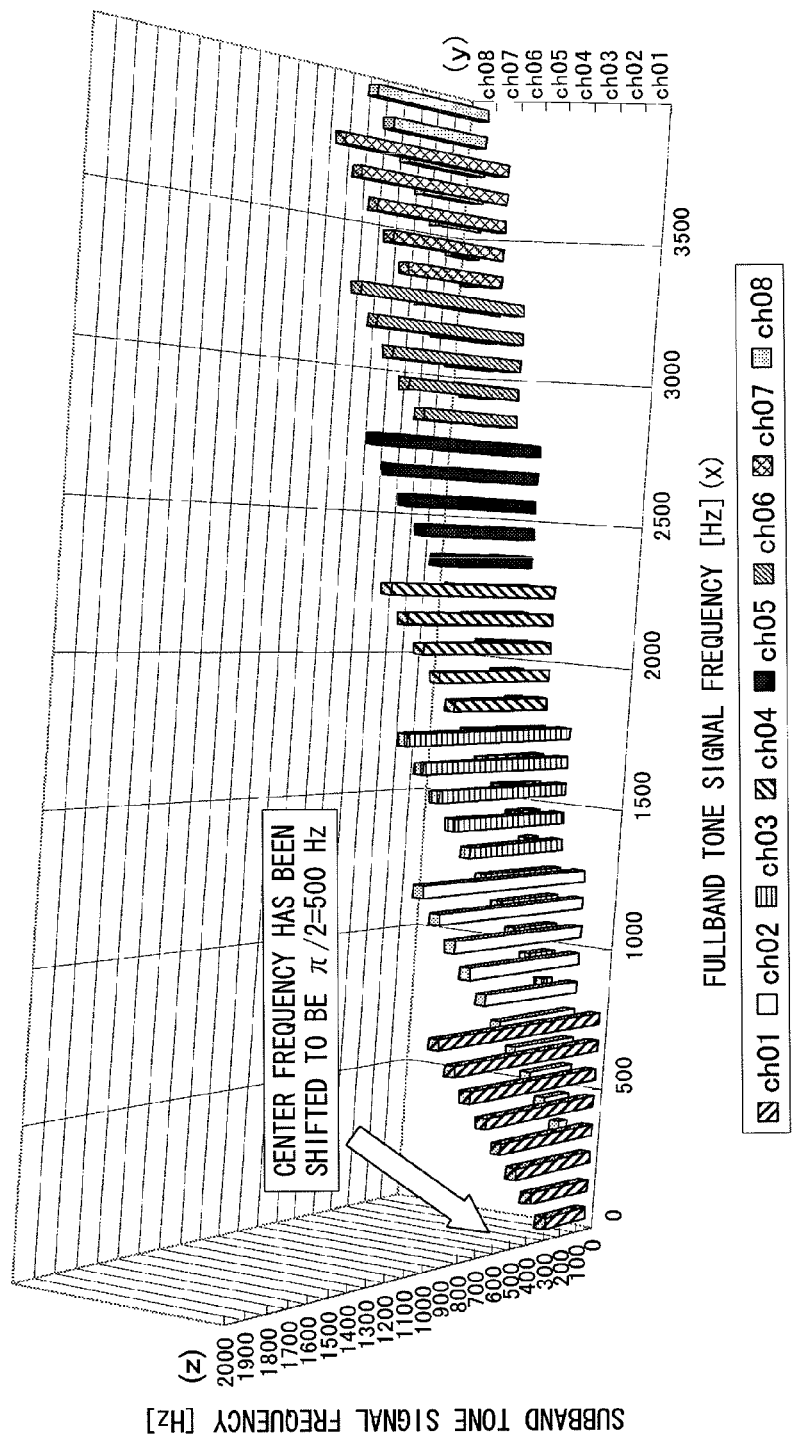
FIG. 3 is a graph showing correspondence of frequencies between before and after an odd type subband analysis process including an SSB modulation process when the number of subbands is 16 and the decimation rate is four on a channel-by-channel basis.

The SSB modulation process by the GDFT/SSB modulation batch process unit 81 is a process that adjusts the center frequencies after the subband analysis process to π/2. An example applied to FIG. 2 is shown in FIG. 3. In this case, since the decimation rate is four, the signal after the subband analysis process becomes that of 8/4=2 kHz sampled, and π/2 becomes 2 kHz/4=500 Hz.

Provided that m is an time index after the subband analysis process, a complex-valued signal before the SSB modulation process is $X_k^{GDFT}(m)$ and a real-valued signal after the SSB modulation process is $X_k^{SSB}(m)$, $X_k^{SSB}(m)$ can be represented in a following equation (8).

[Expression 8]

$$X_k^{SSB}(m) = Re[X_k^{GDFT}(m) \cdot e^{j\pi(1-2k)m/4}]$$

$$k=0,1,\ldots,K/2-1$$

$$m=0,1,\ldots \tag{8}$$

Furthermore, provided that a real-valued signal after the analysis filter process by the analysis filter process unit 21 is $x_m(r)$, $X_k^{GDFT}(m)$ becomes a following equation (9), which is in turn substituted into the above equation (8), and $X_k^{SSB}(m)$ can be calculated by a following equation (10).

[Expression 9]

$$X_k^{GDFT}(m) = \sum_{r=0}^{K-1} x_m(r) W_K^{-(k+1/2)(r+n_0)} \tag{9}$$

$$k = 0, 1, \ldots, K/2 - 1$$
$$m = 0, 1, \ldots$$

[Expression 10]

$$\begin{aligned} X_k^{SSB}(m) &= \text{Re}\left[\sum_{r=0}^{K-1} x_m(r) W_K^{-(k+1/2)(r+n_0)} \cdot e^{j\pi(1-2k)m/4}\right] \\ &= \text{Re}\left[\sum_{r=0}^{K-1} x_m(r) e^{-j2\pi(k+1/2)(r+n_0)/K} \cdot e^{j\pi(1-2k)m/4}\right] \\ &= \sum_{r=0}^{K-1} x_m(r) \cos\left\{\frac{2\pi(k+1/2)(r+n_0)}{K} - \frac{\pi(1-2k)m}{4}\right\} \end{aligned} \tag{10}$$

$$k = 0, 1, \ldots, K/2 - 1$$
$$m = 0, 1, \ldots$$

Representation of the above equation (10) in a form of a matrix calculation, where $G_1(m)$ is a matrix with (K/2) rows and K columns, is a following equation (11). Here, a matrix $G_1(m)$ that converts $x_m(r)$, where r=0, K−1, into $X_k^{SSB}(m)$, where k=0, ..., K/2−1, is a following equation (12).

[Expression 11]

$$\begin{bmatrix} X_0^{SSB}(m) \\ X_1^{SSB}(m) \\ \ldots \\ X_{K/2-1}^{SSB}(m) \end{bmatrix} = G_1(m) \begin{bmatrix} x_m(0) \\ x_m(1) \\ \ldots \\ x_m(K-1) \end{bmatrix} \tag{11}$$

$$m = 0, 1, \ldots$$

[Expression 12]

$$G_1(m) = \begin{bmatrix} \cos\left[\frac{2\pi}{2K}\left\{(n_0 - \frac{Km}{4})\right\}\right] & \cos\left[\frac{2\pi}{2K}\left\{(n_0+1) - \frac{Km}{4}\right\}\right] & \ldots & \cos\left[\frac{2\pi}{2K}\left\{\begin{array}{c}(n_0+K-1) - \\ \frac{Km}{4}\end{array}\right\}\right] \\ \cos\left[\frac{2\pi}{2K}\left\{3n_0 + \frac{Km}{4}\right\}\right] & \cos\left[\frac{2\pi}{2K}\left\{3(n_0+1)\frac{Km}{4}\right\}\right] & \ldots & \cos\left[\frac{2\pi}{2K}\left\{\begin{array}{c}3(n_0+K-1) + \\ \frac{Km}{4}\end{array}\right\}\right] \\ \ldots & \ldots & \ldots & \ldots \\ \cos\left[\frac{2\pi}{2K}\left\{\begin{array}{c}(K-1)n_0 + \\ \frac{K(K-3)m}{4}\end{array}\right\}\right] & \cos\left[\frac{2\pi}{2K}\left\{\begin{array}{c}(K-1)(n_0+1) + \\ \frac{K(K-3)m}{4}\end{array}\right\}\right] & \ldots & \cos\left[\frac{2\pi}{2K}\left\{\begin{array}{c}(K-1) \\ (n_0+K-1) + \\ \frac{K(K-3)m}{4}\end{array}\right\}\right] \end{bmatrix} \tag{12}$$

$$m = 0, 1, \ldots$$

Thus, according to the matrix calculation of the above equation (11), the GDFT process and the SSB modulation process by the GDFT/SSB modulation batch process unit 81 can be performed in batch.

Furthermore, if m is a multiple of 8 in the above equation (12), the second term in the cosine function becomes an integral multiple of $2\pi$. Accordingly, provided that m' is defined as a following equation (13), there holds a relationship of a following equation (14) between $G_1(m)$ and $G_1(m')$, where mod (value, divisor) is a function that returns a remainder when the value is divided by the divisor.

[Expression 13]

$$m' = \text{mod}(m, 8)$$

$$m = 0, 1, \ldots \tag{13}$$

[Expression 14]

$$G_1(m) = G_1(m')$$

$$m = 0, 1, \ldots \tag{14}$$

Therefore, if $G_1(m')$, where m'=0, ..., 7, is preliminary calculated and stored, the amount of arithmetic required for the above equation (11) is only K×(K/2) times of real-valued product-sum arithmetic.

[example of the SSB demodulation process and the matrix for the inverse GDFT process when the number of subbands is K and the decimation rate is N=K/4]

Next, when the subband synthesis process is performed in the signal processing device on the demodulation side shown in FIG. 1B, an example of the SSB demodulation process and the matrix for the inverse GDFT process, where the number of subbands is K and the decimation rate is N=K/4, will be described.

Provided that the real-valued signal before the SSB demodulation process by demodulation/inverse GDFT batch process unit 82 is $X'^{SSB}_k(m)$ and the complex-valued signal after the SSB demodulation process is $X'^{GDFT}_k(m)$, $X'^{GDFT}_k(m)$ can be represented in the following equation (15).

[Expression 15]

$$X'^{GDFT}_k(m) = X'^{SSB}_k(m) e^{-j\pi(1-2k)m/4}$$

$$s = 0, 1, \ldots, K-1$$

$$m = 0, 1, \ldots \quad (15)$$

Furthermore, provided that the real-valued signal before the synthesis filter process is $x'_m(s)$, $X'^{GDFT}_k(m)$ becomes a following expression (16), which in turn substituted into the above equation (15), thereby allowing $x'_m(s)$ to be calculated according to a following equation (17).

[Expression 16]

$$x'_m(s) = \mathrm{Re}\left[\sum_{k=0}^{K-1} X'^{GDFT}_k(m) W_K^{(k+1/2)(s+n_0)}\right] \quad (16)$$

$$s = 0, 1, \ldots, K-1$$

$$m = 0, 1, \ldots$$

[Expression 17]

$$\begin{aligned} x'_m(s) &= \mathrm{Re}\left[\sum_{k=0}^{K-1} X'^{SSB}_k(m) W_K^{(k+1/2)(s+n_0)} \cdot e^{-j\pi(1-2k)m/4}\right] \\ &= \mathrm{Re}\left[\sum_{k=0}^{K-1} X'^{SSB}_k(m) e^{j2\pi(k+1/2)(k+1/2)(s+n_0)K} \cdot e^{-j\pi(1-2k)m/4}\right] \\ &= \sum_{k=0}^{K/2-1} X'^{SSB}_k(m) \cos\left\{\frac{2\pi(k+1/2)(s+n_0)}{K} - \frac{\pi(1-2k)m}{4}\right\} \end{aligned} \quad (17)$$

$$s = 0, 1, \ldots, K-1$$

$$m = 0, 1, \ldots$$

Representation of the above equation (17) in a form of a matrix calculation, where $G_2(m)$ is a matrix with K rows and (K/2) columns, is a following equation (18). Here, a matrix $G_2(m)$ that converts $X'^{SSB}_k(m)$, where $k=0, \ldots, K/2-1$, into $x'_m(s)$, where $s=0, \ldots, K-1$, is a following equation (19).

[Expression 18]

$$\begin{bmatrix} x'_m(0) \\ x'_m(1) \\ \ldots \\ x'_m(K-1) \end{bmatrix} = G_2(m) \begin{bmatrix} X'^{SSB}_0(m) \\ X'^{SSB}_1(m) \\ \ldots \\ X'^{SSB}_{K/2-1}(m) \end{bmatrix} \quad (18)$$

$$m = 0, 1, \ldots$$

[Expression 19]

$$G_2(m) = \begin{bmatrix} \cos\left[\frac{2\pi}{2K}\left\{(n_0 - \frac{Km}{4})\right\}\right] & \cos\left[\frac{2\pi}{2K}\left\{3n_0 + \frac{Km}{4}\right\}\right] & \ldots & \cos\left[\frac{2\pi}{2K}\left\{\frac{(K-1)n_0 + K(K-3)m}{4}\right\}\right] \\ \cos\left[\frac{2\pi}{2K}\left\{(n_0+1) - \frac{Km}{4}\right\}\right] & \cos\left[\frac{2\pi}{2K}\left\{3(n_0+1)\frac{Km}{4}\right\}\right] & \ldots & \cos\left[\frac{2\pi}{2K}\left\{\frac{(K-1)(n_0+1) + K(K-3)m}{4}\right\}\right] \\ \ldots & \ldots & \ldots & \ldots \\ \cos\left[\frac{2\pi}{2K}\left\{\binom{n_0+}{K-1} - \frac{Km}{4}\right\}\right] & \cos\left[\frac{2\pi}{2K}\left\{3\binom{n_0+}{K-1} + \frac{Km}{4}\right\}\right] & \ldots & \cos\left[\frac{2\pi}{2K}\left\{\frac{(K-1)(n_0+K-1) + K(K-3)m}{4}\right\}\right] \end{bmatrix} \quad (19)$$

$$m = 0, 1, \ldots$$

Thus, according to the matrix calculation of the above equation (18), the SSB demodulation process and the inverse GDFT process can be performed in butch.

Furthermore, if m is a multiple of 8 in the above equation (19), the second term in the cosine function becomes an integral multiple of $2\pi$. Accordingly, provided that m' defined by the above equation (13) is used, there holds a relationship of a following equation (20) between $G_2(m)$ and $G_2(m')$.

[Expression 20]

$$G_2(m) = G_2(m')$$

$$m = 0, 1, \ldots \quad (20)$$

Therefore, $G_2(m')$, where $m' = 0, \ldots, 7$ is preliminary calculated and stored, the amount of arithmetic required for the equation (17) is only $(K/2) \times K$ times of real-valued product-sum arithmetic.

Figure 18A:
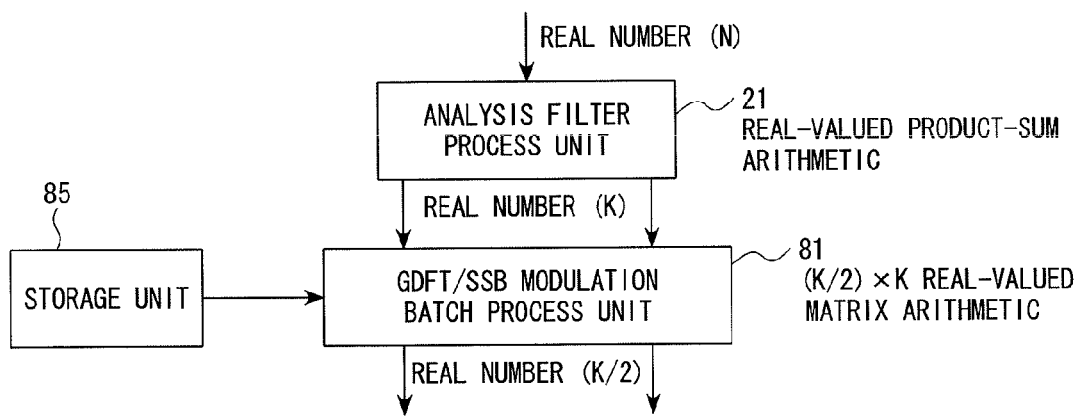
FIG. 18A and FIG. 18B are the block diagrams showing another configuration of the signal processing device according to an embodiment of the present invention.
Figure 18B:
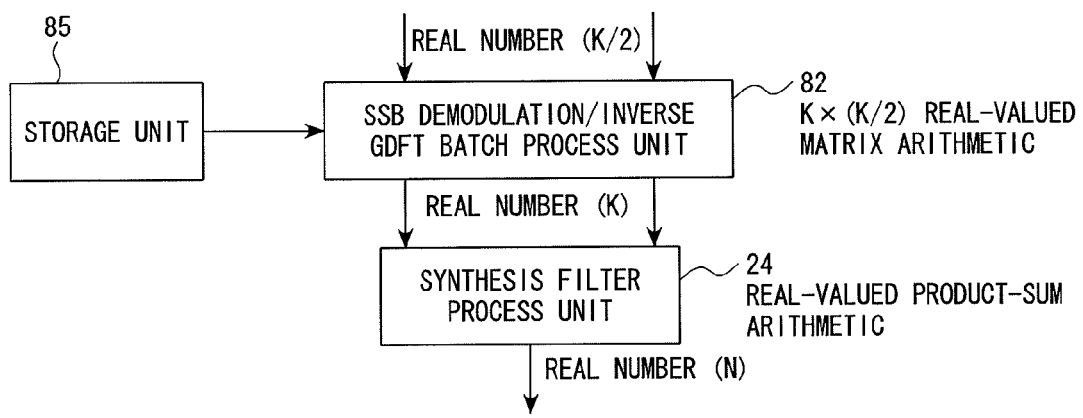

Furthermore, since the matrix $G_2(m)$ of the above equation (18) is the transposed matrix of the matrix $G_1(m)$, it is adequate that any one of the matrix $G_1(m')$, where $m'=0, \ldots, 7$, and the matrix $G_2(m')$, where $m'=0, \ldots, 7$, is stored. More specifically, as shown in FIG. 18A and FIG. 18B, a storage unit 85 shared by the GDFT/SSB modulation batch process unit 81 and the SSB demodulation/inverse GDFT batch process unit 82 may be provided instead of the first storage unit 83 and the second storage unit 84. Any one of the matrix $G_2(m')$, where $m'=0, \ldots, 7$, and the matrix $G_2(m')$, where $m'=0, \ldots, 7$, may be stored in the storage unit 85. The GDFT/SSB modulation batch process unit 81 and the SSB demodulation/inverse GDFT batch process unit 82 may use the matrix $G_1(m')$ or the matrix $G_2(m')$ stored in the storage unit 85, and may performs arithmetic by transposing as necessary. This performance can reduce the capacity of storage.

Provided that an element in the kth row and sth column in the matrix $G_1(m')$ is $g_1(k, s, m')$ and an element in the sth row and kth column in the matrix $G_2(m')$ is $g_2(s, k, m')$, $g_1(k, s, m')$ and $g_2(s, k, m')$ are represented in following equations (21) and (22), respectively.

[Expression 21]

$$g_1(k, s, m') = \cos\left[\frac{2\pi}{2K}\{n_0 + 2n_0 + m'N(2k-1) + s(1+2k)\}\right] \quad (21)$$

$k = 0, 1, \ldots, K/2 - 1$
$s = 0, 1, \ldots, K - 1$
$m' = 0, 1, \ldots, 7$

[Expression 22]

$$g_2(s, k, m') = \cos\left[\frac{2\pi}{2K}\{n_0 - Nm' + s + k(2n_0 + 2s + 2Nm')\}\right] \quad (22)$$

$s = 0, 1, \ldots, K - 1$
$k = 0, 1, \ldots, K/2 - 1$
$m' = 0, 1, \ldots, 7$

Here, if a time offset $n_0$ is selected such that $2n_0$ becomes an integer, every term other than the first term $n_0$ in the cosine function in each of the above equations (21) and (22) becomes an integer. Accordingly, each of $g_1(k, s, m')$ and $g_2(s, k, m')$ has any one of 2K values of cosine function represented in a following equation (23).

[Expression 23]

$$\cos\left\{\frac{2\pi}{2K}(n_0 + \Delta)\right\} \quad (23)$$

$\Delta = 0, 1, \ldots, 2K - 1$

Therefore, instead of the matrix $G_1(m')$, where $m'=0, \ldots, 7$, and the matrix $G_2(m')$ where $m'=0, \ldots, 7$, a cosine function table 91 shown in FIG. 4 is preliminary calculated and created, and stored in both of the first storage unit 83 and the second storage unit 84 respectively, thereby being used in the above equations (11) and (18). This performance can significantly reduce the amount of storage in comparison with the case of storing the matrices.

For instance, when an element of the matrix $G_1(m')$ in the kth row is required in order to calculate the above equation (11) at the time m, it is adequate that m' from the above equation (13), StartOffset$_1$(k, m') from a following equation (24) and StepSize$_1$(k) from a following equation (25) are calculated respectively, and K pieces of data are fetched from StartOffset$_1$(k, m')th from the top of the cosine function table 91 at intervals of StepSize$_1$(k).

[Expression 24]

StartOffset$_1$(k,m')=2$n_0$+m'N(2k−1)

k=0,1,...,K/2−1 m'=0,1,...,7 (24)

[Expression 25]

StepSize$_1$(k)=1+2k k=0,1,...,K/2−1 (25)

Here, it is provided that both StartOffset$_1$(k, m') and StepSize$_1$(k) are integers, the step advances to the downward direction in the cosine function table 91 when the value is positive, and the step advances to the upward direction when the value is negative. Furthermore, it is provided that the step returns to the top when exceeding the bottom of the cosine function table 91, and the step conversely returns to the bottom when exceeding the top of the cosine function table 91. It is also adequate that a plurality of periods of cosine function table 91 is stored in conjunction with each other such that the step can exceeds neither bottom nor top of the cosine function table 91.

Likewise, when the sth row element in the matrix $G_2(m')$ is required in order to calculate the above equation (18) at the time m, it is adequate that m' from the above equation (13), StartOffset$_2$(s, m') from a following equation (26) and StepSize$_2$(s, m') from a following equation (27) are acquired, respectively, and K/2 pieces of data are fetched from StartOffset$_2$(s, m')th from the top of the cosine function table 91 at intervals of StepSize$_2$(s, m').

[Expression 26]

StartOffset$_2$(s,m')=−Nm'+s s=0,1,...,K−1 m'=0,1,...,7 (26)

[Expression 27]

StepSize$_2$(s,m')=2$n_0$+2s+2Nm' s=0,1,...,K−1 m'=0,1,...,7 (27)

While storing either matrix $G_1(m')$, where $m'=0, \ldots, 7$, or matrix $G_2(m')$ where $m'=0, \ldots, 7$, requires $4K^2$ words of memory, storing the cosine function table 91 requires 22.5 K words even including StartOffset$_1$(k, m'), StepSize$_1$(k), StartOffset$_2$(s, m') and StepSize$_2$(s, m'), thereby allowing the amount of required memory to be significantly reduced by 35% when the number of subbands is K=16 and 18% when the number of subbands is K=16 in comparison with the case of storing the aforementioned matrix.

In this case, as shown in FIG. 18A and FIG. 18B, it is also adequate that a shared storage unit 85 is provided instead of the first storage unit 83 and the second storage unit 84, the cosine function table 91 shown in FIG. 4 is stored in the storage unit 85, and the DFT/SSB modulation batch process unit 81 and the SSB demodulation/inverse GDFT batch process unit 82 perform the process using the cosine function table 91 stored in the storage unit 85. This performance can further reduce the amount of storage.

[the amount of arithmetic when the number of subbands is K and the decimation ratio is N=K/4, and the arithmetic accuracy when fixed point arithmetic is adopted]

Next, in the signal processing device according to this embodiment, the amount of arithmetic when the number of subbands is K and the decimation ratio is N=K/4, and the arithmetic accuracy when fixed point arithmetic is adopted will be described.

Figure 5:
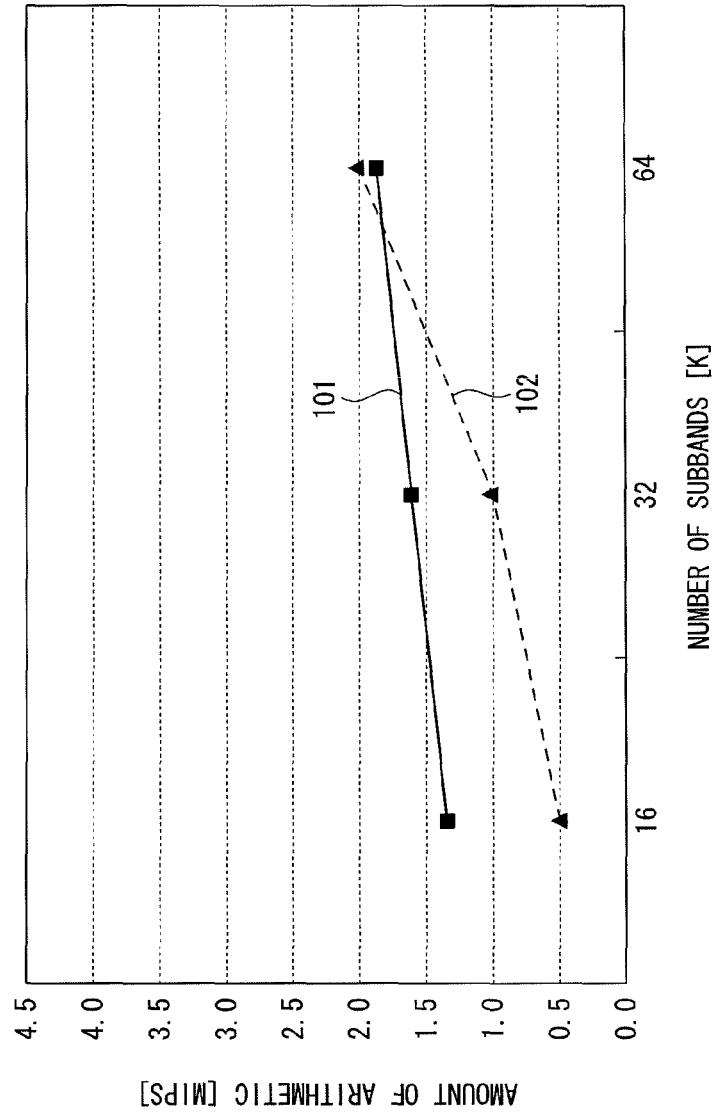
FIG. 5 is a graph comparing amounts of arithmetic between a conventional method and a method of the present application that is a subband analysis/synthesis process method according to this embodiment with each other.

FIG. 5 is a graph showing a relationship between the amount of arithmetic [MIPS] required for the subband analysis/synthesis process (except the analysis filter process and the synthesis filter process common to a following conventional method and the method of the present application) when the sampling frequency of the input signal is 8 kHz, the number of subbands is K and the decimation ratio is N=K/4 and the number of subbands K with respect to the conventional method 101 performing conventional odd type and real-valued type subband analysis/synthesis process using the FFT process in the signal processing device based on Non- Patent Document 1 shown in FIG. 16A and FIG. 16B and the method of the present application 102 performing the subband analysis/synthesis process in the signal processing device shown in FIG. 1A and FIG. 1B.

Here, the amount of arithmetic is expressed in MIPS (Million Instructions Per Second), and it is assumed that a product-sum arithmetic between a complex number and a complex number is four times a product-sum arithmetic between a real number and a real number, a product-sum arithmetic between a complex number and a real number is two times a product-sum arithmetic between a real number and a real number, and a case of only fetching the real part from a product-sum arithmetic between a complex number and a complex number is two times a product-sum arithmetic between a real number and a real number.

Here, the reason to let the number of subbands K be one of 16, 32 and 64 will also be described.

In general, the larger the number of subbands K is, theoretically, the greater the advantageous effect by the division process is achieved. More specifically, the convergence is improved in the case of the echo canceller, and a higher decimation ratio N can also be adopted, thereby allowing the amount of arithmetic to be reduced. However, in actual fact, since an interference with adjacent bands referred to as crosstalk creates distortion of a synthesized waveform at the border between bands, it is incapable of increasing the number of subbands K without limitation.

Furthermore, since the greater the number of subbands K is the higher in order, the steeper the analysis filter and the synthesis filter are required and also the longer the delay time become, it causes a problem in an application requiring a real time process. Supposing that an FIR (Finite Impulse Response) filter whose number of orders is the square of the number of subbands K is used as the analysis filter and the synthesis filter with respect to an 8 kHz sampling signal, the delay time becomes 8 mS (64th order) when K=8, 32 mS (256th order) when K=16, 128 mS (1024th order) when K=32, and 512 mS (4096th order) when K=64. K=16 or 32 is a practical number of subbands.

It should be noted that while there is possibility of reducing the number of orders by devising the type and coefficient of a filter. However, it is assessed that consideration up to K=64 suffices in an application requiring a real time process of a voice, and the number of subbands more than that is omitted.

As shown in FIG. 5, although the amount of arithmetic of the method of the present application 102 is slightly larger than that of the conventional method 101 when K=64, it is understood that the amount of arithmetic is significantly reduced in most cases, like this: about 40% of that according to the conventional method 101 when K=16, and about 60% of that according to the conventional method 101 when K=32.

Figure 6:
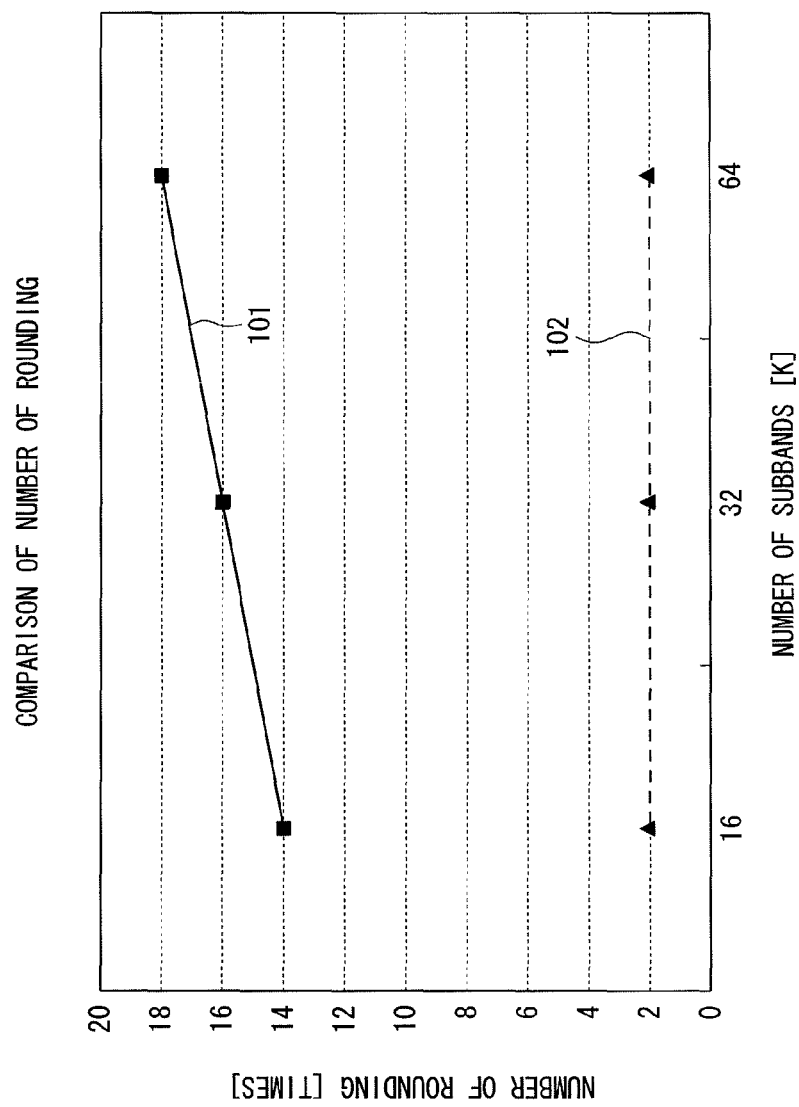
FIG. 6 is a graph comparing the numbers of rounding in the conventional method and the method of the present application with each other.
Figure 17:
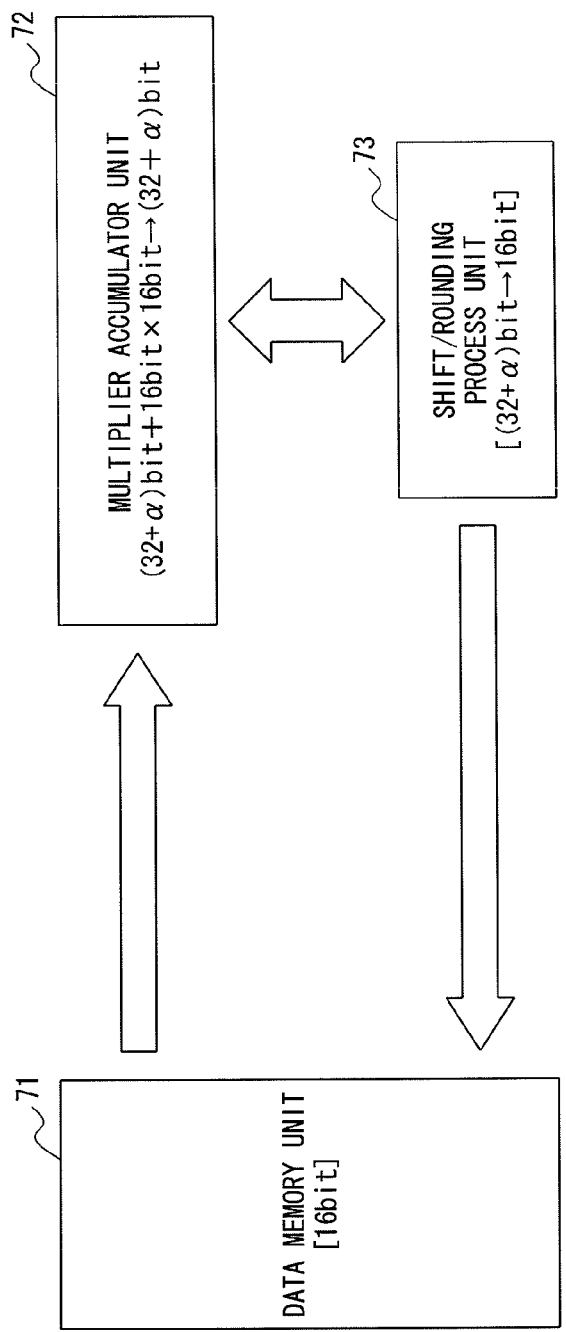
FIG. 17 is a block diagram showing an example of a basic architecture of a 16-bit fixed point processor.

FIG. 6 is a graph comparing the number of rounding (except the analysis filter process and the synthesis filter process common to the above conventional method 101 and the method of the present application 102) in a process of rounding, for instance, (32+α) bits to 16 bits, which occurs in the subband analysis/synthesis process when adopting fixed point arithmetic providing the processor shown in FIG. 17, with respect to the numbers of subbands K=16, 32 and 64.

As shown in FIG. 6, it is understood that the number of rounding is significantly reduced in the method of the present application 102 on all the cases including: one-seventh of that of the conventional method 101 when K=16, one-eighth of that of the conventional method 101 when K=32, one-ninth of that of the conventional method 101 when K=64.

Figure 7:
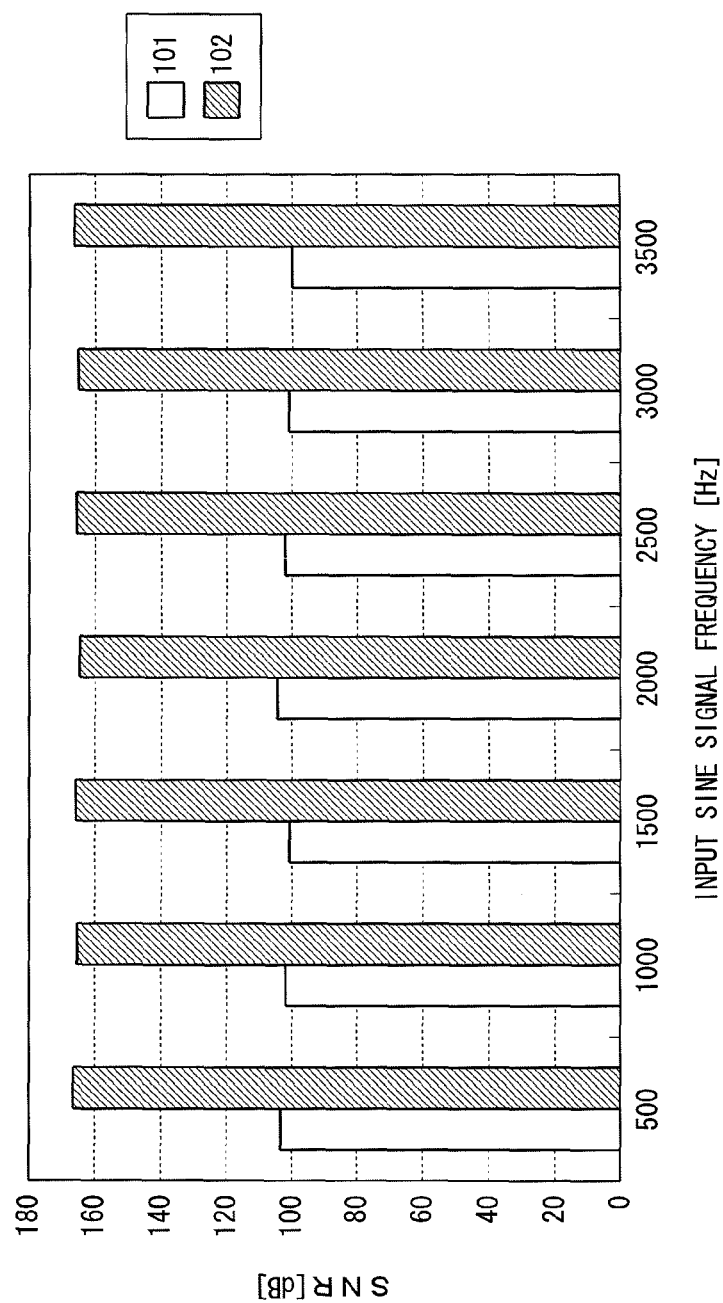
FIG. 7 is a graph comparing magnitudes of distortion due to adopting fixed point arithmetic in the conventional method and the method of the present application with each other.
Figure 8:
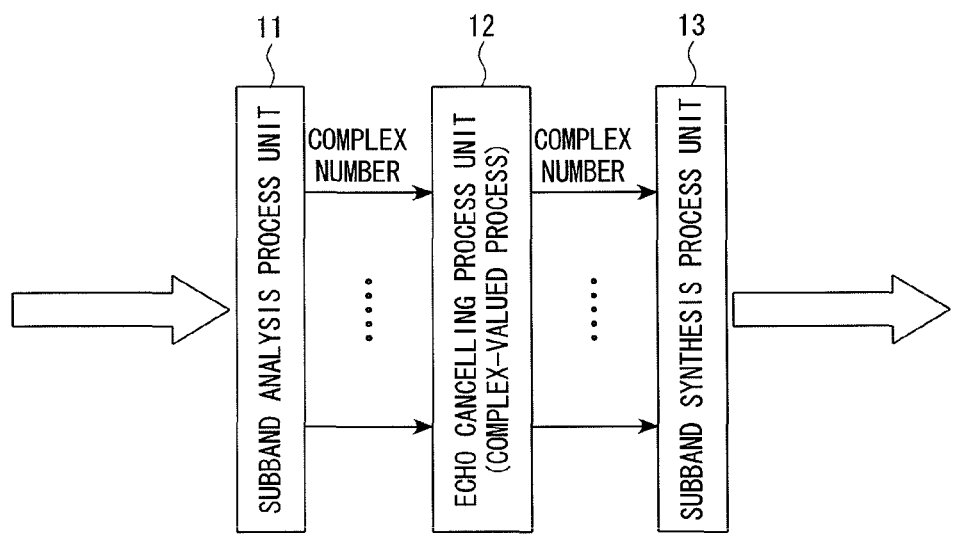
FIG. 8 is a block diagram showing a configuration of the subband echo canceller described in Patent Document 1.
Figure 9:
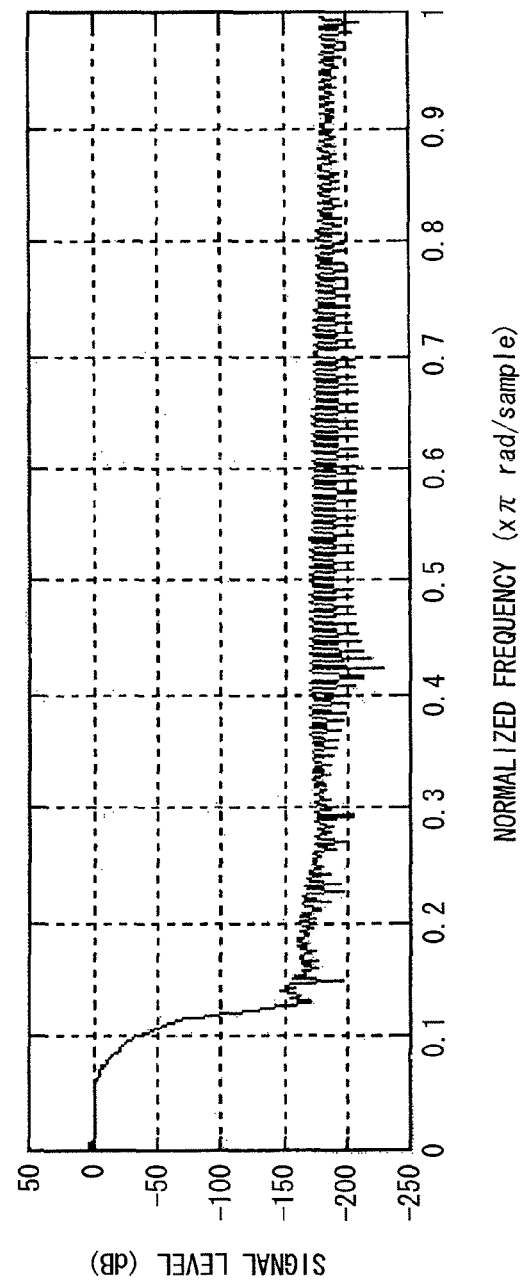
FIG. 9 is a diagram showing an example of frequency response of a prototype filter.
Figure 10A:
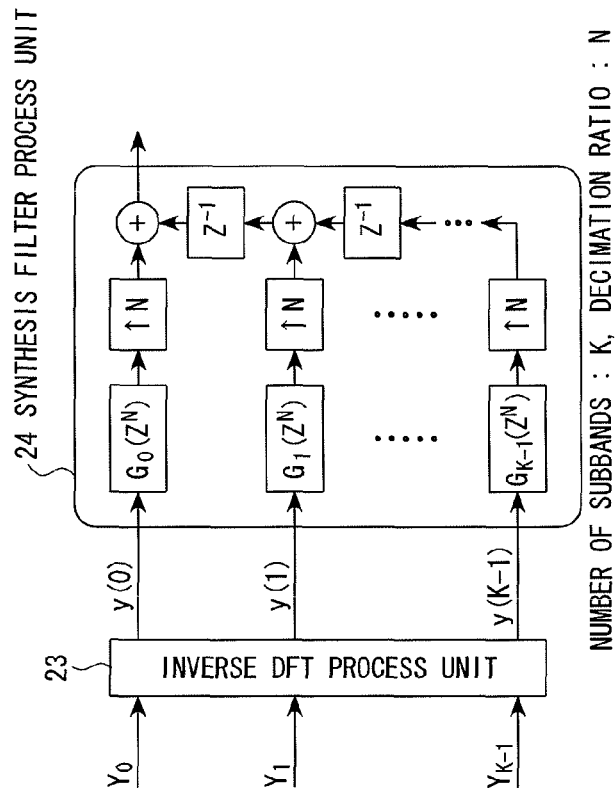
FIG. 10A is a block diagram showing a configuration of a signal processing device for an even type subband analysis process.
Figure 10B:
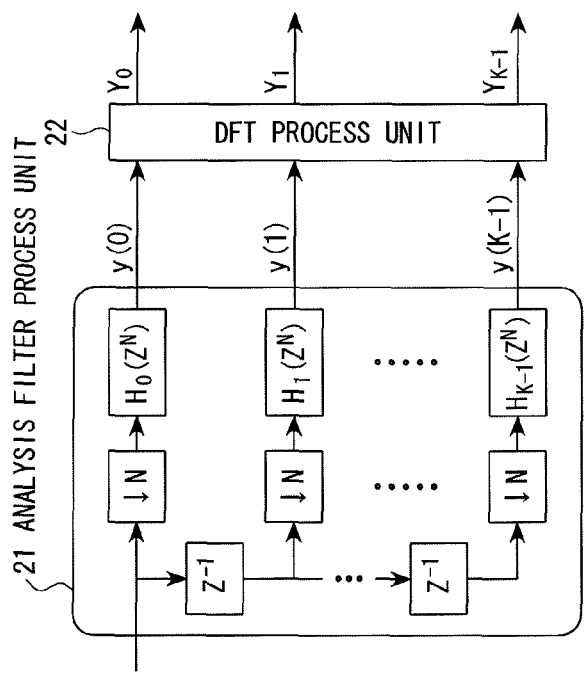
FIG. 10B is a block diagram showing a configuration of a signal processing device for an even type subband synthesis process.
Figure 11:
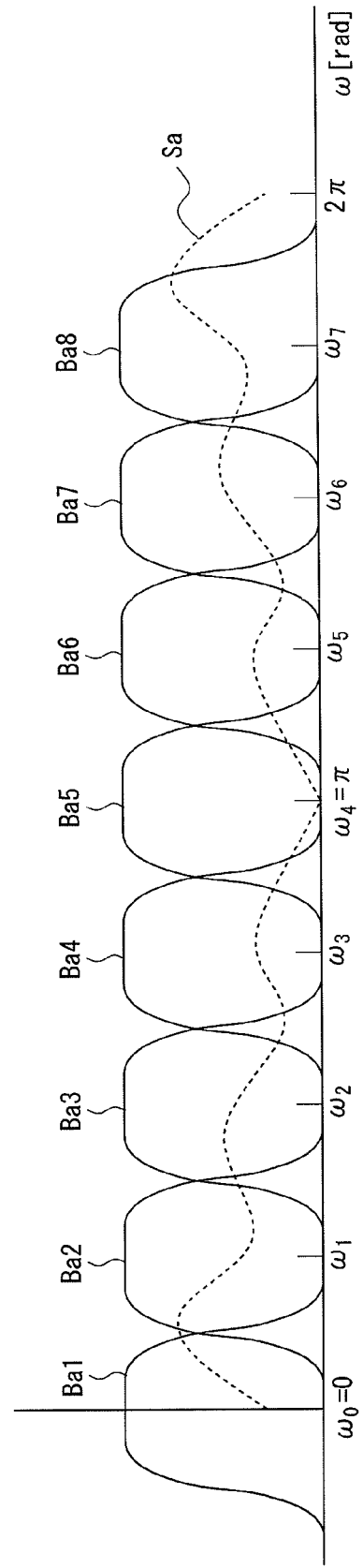
FIG. 11 is a diagram showing the center frequency $\omega_k$ in each subband when the even type subband analysis process is performed, provided that the number of subbands is K=8.
Figure 12:
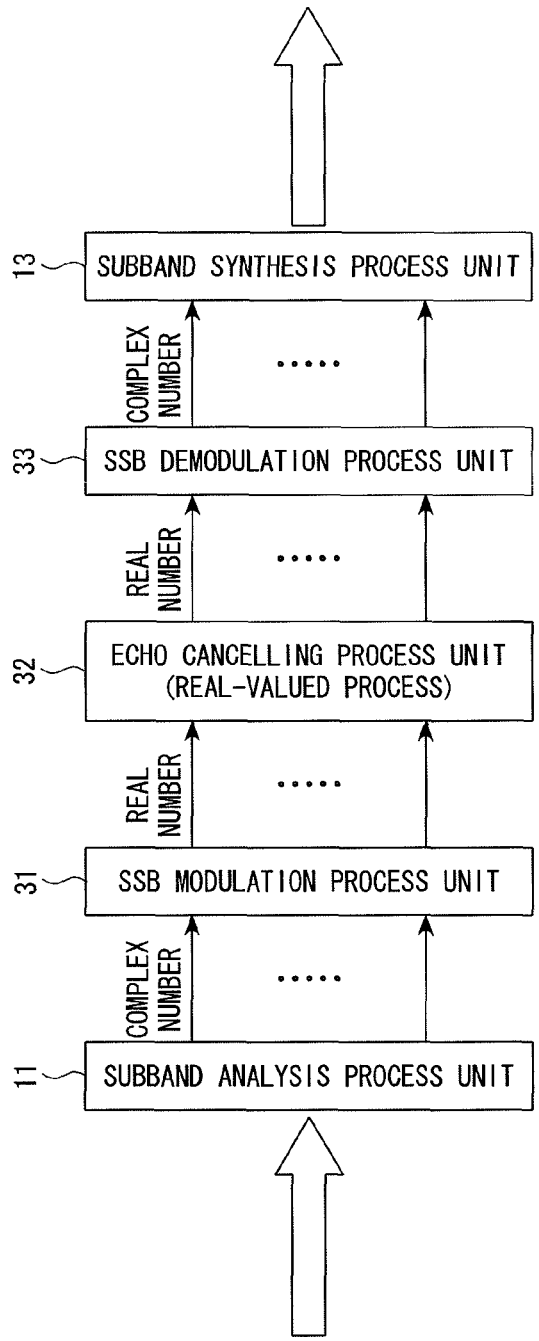
FIG. 12 is a block diagram showing a configuration of a subband canceller described in Patent Document 2.
Figure 13:
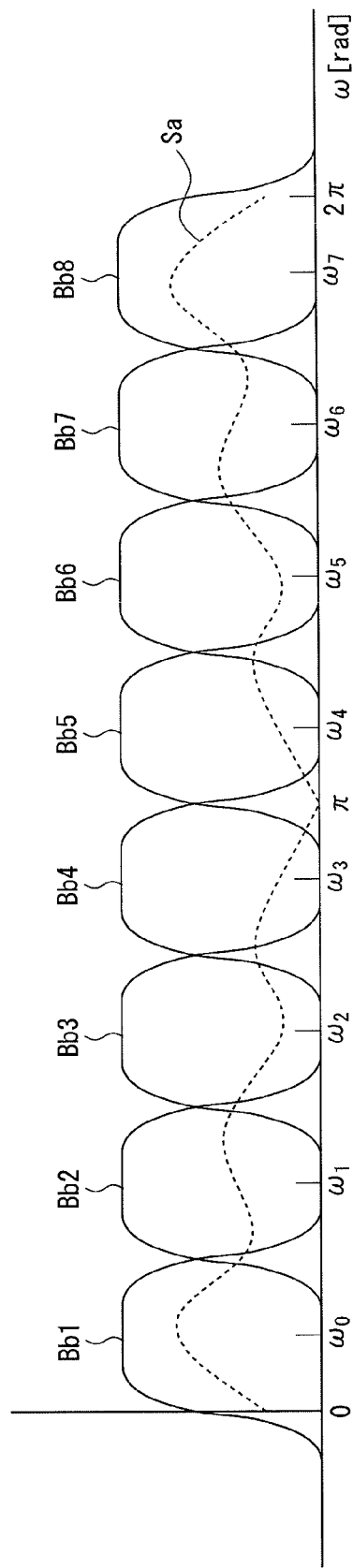
FIG. 13 is a diagram showing the center frequency $\omega_k$ in each subband when the odd type subband analysis process is performed, provided that the number of subbands is K=8.
Figure 14A:
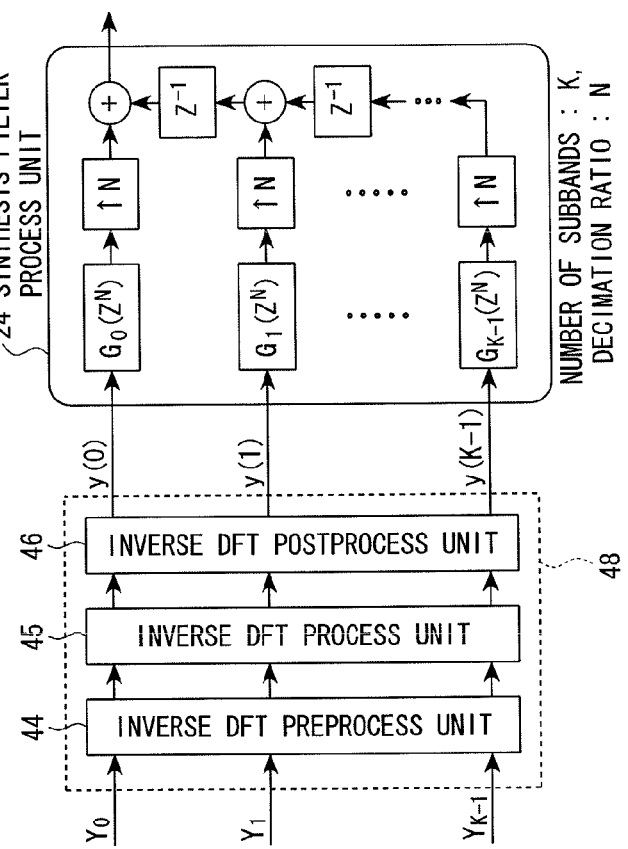
FIG. 14A is a block diagram showing a configuration of a signal processing device for an odd type subband analysis process to which an FFT is applicable.
Figure 14B:
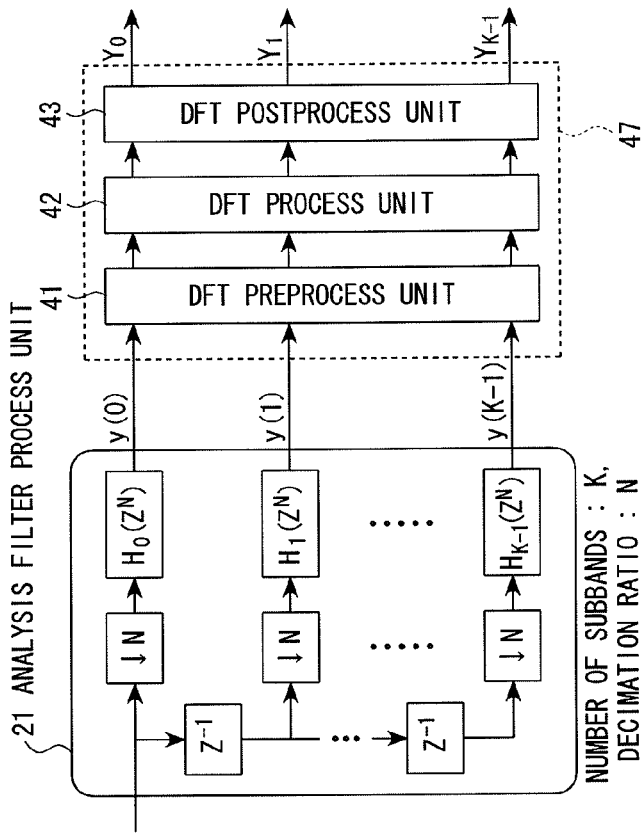
FIG. 14B is a block diagram showing a configuration of a signal processing device for an odd type subband synthesis process to which an FFT is applicable.
Figure 15B:
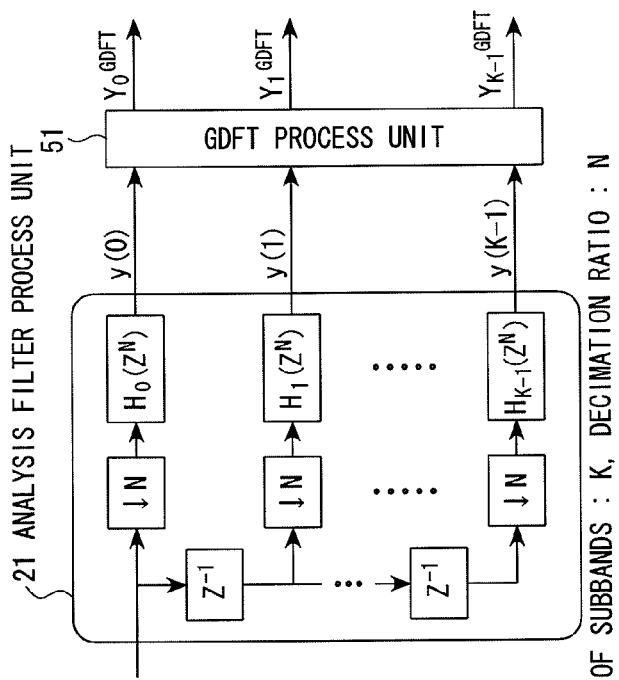
FIG. 15B is a block diagram showing a configuration where three units, or an inverse DFT preprocess unit, an inverse DFT process unit and an inverse DFT postprocess unit in FIG. 14B, are substituted by an inverse GDFT process unit.
Figure 15A:
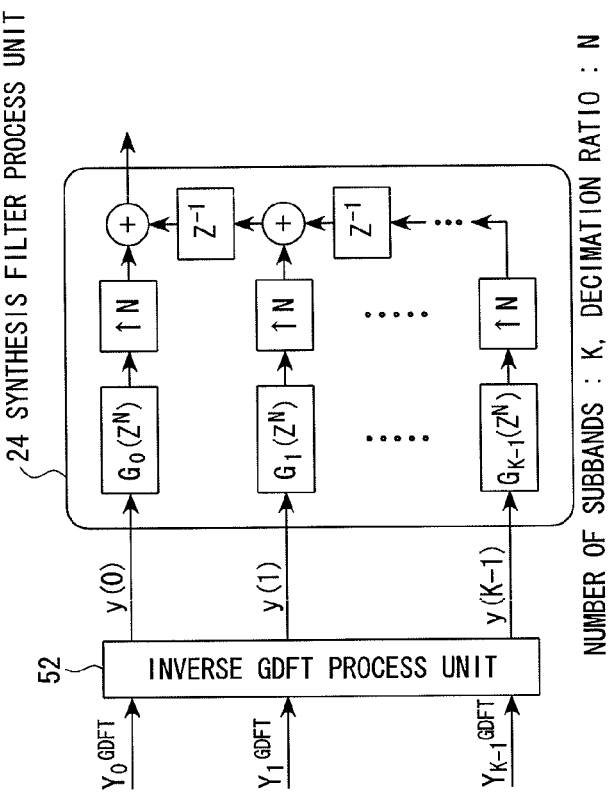
FIG. 15A is a block diagram showing a configuration where three units, or a DFT preprocess unit, a DFT process unit and a DFT postprocess unit in FIG. 14A, are substituted by a GDFT process unit.

Next, it will be shown how the difference of the numbers of rounding affects the arithmetic accuracy when adopting fixed point arithmetic. FIG. 7 is a graph where, with respect to the conventional method 101 and the method of the present application 102, full scale sine waves from 500 Hz to 3500 Hz at 500 Hz intervals is used as an input signal, the subband analysis process and the subband synthesis process are performed by floating point arithmetic and 16-bit fixed point arithmetic assuming one processor shown in FIG. 17, an SNR in which distortion due to adoption of 16-bit fixed point arithmetic is assumed as noise (the power of a synthesis signal by 16-bit fixed point arithmetic is divided by the power of the difference between a synthesis signal by floating point arithmetic and a synthesis signal by 16-bit fixed point arithmetic, whose logarithm is taken, and is multiplied by ten) is calculated, and accuracy of the 16-bit fixed point arithmetic is evaluated on every frequency of inputted sine waves.

As shown in FIG. 7, it is understood that, according to the method of the present application 102, the distortion due to adoption of 16-bit fixed point arithmetic is hardly occurs and distortion is smaller by 60 dB than that of the conventional method 101 in terms of SNR value.

Thus, the signal processing device according to this embodiment allows deterioration of arithmetic accuracy due to adoption of fixed point arithmetic to hardly be created with amount of arithmetic as small as possible in a case where a real time voice processing is used as an application when performing odd type and real-valued type subband analysis/synthesis process.

Furthermore, every piece of input and output data of the analysis filter process unit 21, the GDFT/SSB modulation batch process unit 81, the SSB demodulation/inverse GDFT batch process unit 82 and the synthesis filter process unit 24 can individually be defined as a real number, thereby facilitating arithmetic.

INDUSTRIAL APPLICABILITY

As set forth above, according to the present invention, there are advantageous effects that allow deterioration of arithmetic accuracy due to adoption of fixed point arithmetic to hardly be created with amount of arithmetic as small as possible in a case where a real time voice processing is used as an application when performing odd type and real-valued type subband analysis/synthesis process.

The invention claimed is:

1. An echo canceller in a communication device comprising a signal processing device performing a subband division process on an input signal, the signal processing device comprising:

an analysis filter process unit configured to perform an analysis filter process on real-valued input data decimated by a decimation ratio and to output real-valued data for K subbands, when K=4N, where K is the number of subbands and N is the decimation ratio; and a GDFT/SSB modulation batch process unit configured to perform in batch a GDFT process, which is a Generalized Discrete Fourier Transformation process where a time offset is $n_0$, and an SSB modulation process, which is a single sideband modulation process, using (K/2)×K real-valued matrix $G_1(m)$ represented in an equation

[Expression 1]

$$G_1(m) = \begin{bmatrix} \cos\left[\frac{2\pi}{2K}\left\{\left(n_0 - \frac{Km}{4}\right)\right\}\right] & \cos\left[\frac{2\pi}{2K}\left\{(n_0+1) - \frac{Km}{4}\right\}\right] & \cdots \\ \cos\left[\frac{2\pi}{2K}\left\{3n_0 + \frac{Km}{4}\right\}\right] & \cos\left[\frac{2\pi}{2K}\left\{3(n_0+1) + \frac{Km}{4}\right\}\right] & \cdots \\ \cdots & \cdots & \cdots \\ \cos\left[\frac{2\pi}{2K}\left\{(K-1)n_0 + \frac{K(K-3)m}{4}\right\}\right] & \cos\left[\frac{2\pi}{2K}\{(K-1)(n_0+1) + \frac{K(K-3)m}{4}\}\right] & \cdots \end{bmatrix}$$

$$\left. \begin{array}{c} \cos\left[\frac{2\pi}{2K}\left\{(n_0+K-1)-\frac{Km}{4}\right\}\right] \\ \cos\left[\frac{2\pi}{2K}\left\{3(n_0+K-1)+\frac{Km}{4}\right\}\right] \\ \ldots \\ \cos\left[\frac{2\pi}{2K}\left\{(K-1)(n_0+K-1)+\frac{K(K-3)m}{4}\right\}\right] \end{array} \right]$$

$m = 0, 1, \ldots$ and according to an equation $$\begin{bmatrix} X_0^{SSB}(m) \\ X_1^{SSB}(m) \\ \ldots \\ X_{K/2-1}^{SSB}(m) \end{bmatrix} = G_1(m) \begin{bmatrix} x_m(0) \\ x_m(1) \\ \ldots \\ x_m(K-1) \end{bmatrix}$$ [Expression 2]

$m = 0, 1, \ldots$ on the outputted real-valued data for K subbands, $x_m(0)$, $x_m(1)$, ..., $x_m(K-1)$, from the analysis filter process unit provided that m is a time index of the outputted real-valued data for K subbands from the analysis filter process unit, and to output real-valued subbands data, $X_0^{SSB}(m)$, $X_1^{SSB}(m)$, ..., $X_{K/2-1}^{SSB}(m)$ for (K/2) frequency channels.

2. The signal processing device according to claim 1, further comprising:
a storage unit configured to store the periodically occurring eight patterns of (K/2)×K real-valued matrix for performing the GDFT process and the SSB modulation process,
wherein the GDFT/SSB modulation batch process unit performs the GDFT process and the SSB modulation process in batch using the (K/2)×K real-valued matrix stored in the storage unit.

3. An echo canceller in a communication device comprising a signal processing device performing a subband synthesis process on an input signal, the signal processing device comprising:
an SSB demodulation/inverse GDFT batch process unit configured to perform in batch an SSB demodulation process, which is a single sideband demodulation process, and an inverse GDFT process, which is an inverse Generalized Discrete Fourier Transformation process where a time offset is $n_0$, using a K×(K/2) real-valued matrix $G_2(m)$ represented in an equation and according to an equation $$\begin{bmatrix} x'_m(0) \\ x'_m(1) \\ \ldots \\ x'_m(K-1) \end{bmatrix} = G_2(m) \begin{bmatrix} X'^{SSB}_0(m) \\ X'^{SSB}_1(m) \\ \ldots \\ X'^{SSB}_{K/2-1}(m) \end{bmatrix}$$ [Expression 4]

$m = 0, 1, \ldots$ on every input of real-valued subbands data, $X'^{SSB}_0(m)$, $X'^{SSB}_1(m)$, ..., $X'^{SSB}_{K/2-1}$ for (K/2) frequency channels provided that m is a time index of the real-valued subbands data to output real-valued data for K subbands, $x'_m(0)$, $x'_m(1)$, ..., $x'_m(K-1)$, when K=4N, where K is the number of subbands and N is a decimation ratio; and a synthesis filter process unit configured to perform a synthesis filter process on the outputted real-valued data for K subbands from the SSB demodulation/inverse GDFT batch process unit, and to output real-valued data.

4. The signal processing device according to claim 3, further comprising:
a storage unit configured to store the periodically occurring eight patterns of K×(K/2) real-valued matrix for performing the SSB demodulation process and the inverse GDFT process for K subbands,
wherein the SSB demodulation/inverse GDFT batch process unit performs the SSB demodulation process and the inverse GDFT process in batch using the K×(K/2) real-valued matrix stored in the storage unit.

5. An echo canceller in a communication device comprising a signal processing device performing a subband division process on an input signal, the signal processing device comprising:
an analysis filter process unit configured to perform an analysis filter process on real-valued input data decimated by a decimation ratio and to output real-valued data for K subbands, when K=4N, where K is the number of subbands and N is the decimation ratio; and a GDFT/SSB modulation batch process unit configured to perform a GDFT process, which is a Generalized Discrete Fourier Transformation process, and an SSB modulation process, which is a single sideband modulation process adjusting a center frequency after the

[Expression 3]

$$G_2(m) = \begin{bmatrix} \cos\left[\frac{2\pi}{2K}\left\{\left(n_0-\frac{Km}{4}\right)\right\}\right] & \cos\left[\frac{2\pi}{2K}\left\{3n_0+\frac{Km}{4}\right\}\right] & \ldots & \cos\left[\frac{2\pi}{2K}\left\{(K-1)n_0+\frac{K(K-3)m}{4}\right\}\right] \\ \cos\left[\frac{2\pi}{2K}\left\{(n_0+1)-\frac{Km}{4}\right\}\right] & \cos\left[\frac{2\pi}{2K}\left\{3(n_0+1)+\frac{Km}{4}\right\}\right] & \ldots & \cos\left[\frac{2\pi}{2K}\left\{(K-1)(n_0+1)+\frac{K(K-3)m}{4}\right\}\right] \\ \ldots & \ldots & \ldots & \ldots \\ \cos\left[\frac{2\pi}{2K}\left\{(n_0+K-1)-\frac{Km}{4}\right\}\right] & \cos\left[\frac{2\pi}{2K}\left\{3(n_0+K-1)+\frac{Km}{4}\right\}\right] & \ldots & \cos\left[\frac{2\pi}{2K}\left\{(K-1)(n_0+K-1)+\frac{K(K-3)m}{4}\right\}\right] \end{bmatrix}$$

$m = 0, 1, \ldots$ subband analysis process to $\pi/2$, by a $(K/2) \times K$ real-valued matrix arithmetic in batch, on the outputted real-valued data for K subbands from the analysis filter process unit, and to output real-valued subbands data for $(K/2)$ frequency channels;

an SSB demodulation/inverse GDFT batch process unit configured to perform an SSB demodulation process, which is a single sideband demodulation process restoring a frequency whose center frequency after the subband analysis process has been frequency-shifted to $\pi/2$ to a frequency before the frequency-shifting by the SSB modulation process, and an inverse GDFT process, which is an inverse Generalized Discrete Fourier Transformation process, by a $K \times (K/2)$ real-valued matrix

[Expression 5]

$$G_1(m) = \begin{bmatrix} \cos\left[\frac{2\pi}{2K}\left\{(n_0 - \frac{Km}{4})\right\}\right] & \cos\left[\frac{2\pi}{2K}\left\{(n_0+1) - \frac{Km}{4}\right\}\right] & \cdots & \cos\left[\frac{2\pi}{2K}\left\{(n_0+K-1) - \frac{Km}{4}\right\}\right] \\ \cos\left[\frac{2\pi}{2K}\left\{3n_0 + \frac{Km}{4}\right\}\right] & \cos\left[\frac{2\pi}{2K}\left\{3(n_0+1) + \frac{Km}{4}\right\}\right] & \cdots & \cos\left[\frac{2\pi}{2K}\left\{3(n_0+K-1) + \frac{Km}{4}\right\}\right] \\ \cdots & \cdots & \cdots & \cdots \\ \cos\left[\frac{2\pi}{2K}\left\{(K-1)n_0 + \frac{K(K-3)m}{4}\right\}\right] & \cos\left[\frac{2\pi}{2K}\left\{(K-1)(n_0+1) + \frac{K(K-3)m}{4}\right\}\right] & \cdots & \cos\left[\frac{2\pi}{2K}\left\{(K-1)(n_0+K-1) + \frac{K(K-3)m}{4}\right\}\right] \end{bmatrix}$$

$m = 0, 1, \ldots$ arithmetic in batch on real-valued subbands data for $(K/2)$ frequency channels, and to output real-valued data for K subbands; and a synthesis filter process unit configured to perform a synthesis filter process on the outputted real-valued data for K subbands from the SSB demodulation/inverse GDFT batch process unit, and to output real-valued data, wherein provided that a time offset of the GDFT process and the inverse GDFT process is $n_0$, if $2n_0$ is an integer, creating a table of a cosine function with $2\pi/2K$ resolution and storing the table as a cosine function table in storage unit, using a fact that every element of the $(K/2) \times K$ real-valued matrix and the $K \times (K/2)$ real-valued matrix can be represented as a cosine function value with $2\pi/2K$ resolution, and the GDFT/SSB modulation batch process unit performs the GDFT process and the SSB modulation process using the cosine function of the stored cosine function table, and the SSB demodulation/inverse GDFT batch process unit performs the SSB demodulation process and the inverse GDFT process using the cosine function of the stored cosine function table.

6. A signal processing method performing, by an echo canceller in a communication device comprising a signal processing device, a subband division process and a subband synthesis process on an input signal, the signal processing method comprising:

a first step of performing an analysis filter process on of real-valued input data decimated by a decimation ratio to output real-valued data for K subbands, when K=4N, where K is the number of subbands and N is the decimation ratio;

a second step of performing in batch a GDFT process, which is a Generalized Discrete Fourier Transformation process where a time offset is $n_0$, and an SSB modulation process, which is a single sideband modulation process, using $(K/2) \times K$ real-valued matrix $G_1(m)$ represented in an equation and according to an equation $$\begin{bmatrix} X_0^{SSB}(m) \\ X_1^{SSB}(m) \\ \cdots \\ X_{K/2-1}^{SSB}(m) \end{bmatrix} = G_1(m) \begin{bmatrix} x_m(0) \\ x_m(1) \\ \cdots \\ x_m(K-1) \end{bmatrix}$$

[Expression 6]

$m = 0, 1, \ldots$ on the outputted real-valued data for K subbands, $x_m(0)$, $x_m(1)$, $x_m(K-1)$, by the first step provided that m is a time index of the outputted valued data for K subbands to output real-valued subbands data, $X_0^{SSB}(m)$, $X_1^{SSB}(m)$, . . . , $X_{K/2-1}^{SSB}(m)$ for $(K/2)$ frequency channels;

a third step of performing signal processing on every subbands with respect to the real-valued subbands data for $(K/2)$ frequency channels outputted by the second step to output the real-valued subbands data;

a fourth step of performing in batch an SSB demodulation process, which is a single sideband demodulation process, and an inverse GDFT process, which is an inverse Generalized Discrete Fourier Transformation process, where m is a time index of the real-valued subbands data for $(K/2)$ frequency channels outputted by the third step, using $K \times (K/2)$ real-valued matrix $G_2(m)$ represented in an equation

[Expression 7]

$$G_2(m) = \begin{bmatrix} \cos\left[\frac{2\pi}{2K}\left\{(n_0 - \frac{Km}{4})\right\}\right] & \cos\left[\frac{2\pi}{2K}\left\{3n_0 + \frac{Km}{4}\right\}\right] & \cdots & \cos\left[\frac{2\pi}{2K}\left\{(K-1)n_0 + \frac{K(K-3)m}{4}\right\}\right] \\ \cos\left[\frac{2\pi}{2K}\left\{(n_0+1) - \frac{Km}{4}\right\}\right] & \cos\left[\frac{2\pi}{2K}\left\{3(n_0+1) + \frac{Km}{4}\right\}\right] & \cdots & \cos\left[\frac{2\pi}{2K}\left\{(K-1)(n_0+1) + \frac{K(K-3)m}{4}\right\}\right] \\ \cdots & \cdots & \cdots & \cdots \\ \cos\left[\frac{2\pi}{2K}\left\{(n_0+K-1) - \frac{Km}{4}\right\}\right] & \cos\left[\frac{2\pi}{2K}\left\{3(n_0+K-1) + \frac{Km}{4}\right\}\right] & \cdots & \cos\left[\frac{2\pi}{2K}\left\{(K-1)(n_0+K-1) + \frac{K(K-3)m}{4}\right\}\right] \end{bmatrix}$$

$m = 0, 1, \ldots$ and according to an equation $$\begin{bmatrix} x'_m(0) \\ x'_m(1) \\ \cdots \\ x'_m(K-1) \end{bmatrix} = G_2(m) \begin{bmatrix} X_0'^{SSB}(m) \\ X_1'^{SSB}(m) \\ \cdots \\ X_{K/2-1}'^{SSB}(m) \end{bmatrix}$$

[Expression 8]

$m = 0, 1, \ldots$ on every input with respect to the real-valued subbands data, $X_0'^{SSB}(m), X_1'^{SSB}(m), \ldots, X_{K/2-1}'^{SSB}(m)$ to output real-valued data, x'm(0), x'm(1), . . . , x'm(K−1) for K subbands; and a fifth step of performing a synthesis filter process on the K samples of sampled real-valued data outputted by the fourth step to output real-valued data.

\* \* \* \* \*